United States Patent
Oshima

(10) Patent No.: US 12,341,505 B2
(45) Date of Patent: Jun. 24, 2025

(54) DRIVE CIRCUIT

(71) Applicant: TDK CORPORATION, Tokyo (JP)

(72) Inventor: Kazunori Oshima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 444 days.

(21) Appl. No.: 17/620,556

(22) PCT Filed: Feb. 26, 2021

(86) PCT No.: PCT/JP2021/007463
§ 371 (c)(1),
(2) Date: Oct. 3, 2023

(87) PCT Pub. No.: WO2022/180811
PCT Pub. Date: Sep. 1, 2022

(65) Prior Publication Data
US 2024/0022243 A1   Jan. 18, 2024

(51) Int. Cl.
*B41J 2/045* (2006.01)
*H03K 17/60* (2006.01)
*H03K 17/687* (2006.01)

(52) U.S. Cl.
CPC ........ *H03K 17/687* (2013.01); *B41J 2/04541* (2013.01); *H03K 17/60* (2013.01)

(58) Field of Classification Search
CPC .... B41J 2/04541; H03K 17/60; H03K 17/687
USPC .................................................. 327/108, 111
See application file for complete search history.

(56) References Cited

U.S. PATENT DOCUMENTS

| | | | | |
|---|---|---|---|---|
| 5,896,287 A | * | 4/1999 | Mihara | H05B 44/00 363/16 |
| 6,081,075 A | * | 6/2000 | Littlefield | H05B 44/00 315/307 |
| 7,852,127 B2 | | 12/2010 | Kitazawa et al. | |
| 2005/0190125 A1 | * | 9/2005 | Ikeda | G09G 3/2965 345/70 |
| 2022/0060126 A1 | * | 2/2022 | Xu | H10N 30/802 |
| 2022/0169014 A1 | * | 6/2022 | Tabata | H03K 17/6871 |

FOREIGN PATENT DOCUMENTS

JP   5083546 B2   11/2012

\* cited by examiner

*Primary Examiner* — William Hernandez
(74) *Attorney, Agent, or Firm* — Oliff PLC

(57) ABSTRACT

A bridge circuit (30) alternately applies a first voltage and a second voltage having mutually different polarities to a capacitor (200). A diode (41) is connected to one end of the capacitor (200). A diode (42) is connected to another end of the capacitor (200). A capacitor (50) is connected to the diode (41) and the diode (42). A control circuit (60) controls a plurality of switch elements included in the bridge circuit (30) in such a way that electric charge stored in the capacitor (200) moves to the capacitor (50) via the diode (41) when a voltage applied to the capacitor (200) transitions from the first voltage to the second voltage and electric charge stored in the capacitor (200) moves to the capacitor (50) via the diode (42) when a voltage applied to the capacitor (200) transitions from the second voltage to the first voltage.

9 Claims, 16 Drawing Sheets

FIG. 2

| SWITCH ELEMENT | STATE | | | | | | | |
|---|---|---|---|---|---|---|---|---|
| | T1 | T2 | T3 | T4 | T5 | T6 | T7 | T8 |
| SWITCH ELEMENT 31 | ON | ON | ON | OFF | OFF | OFF | ON | ON |
| SWITCH ELEMENT 32 | OFF | OFF | OFF | OFF | ON | OFF | OFF | OFF |
| SWITCH ELEMENT 33 | OFF | OFF | ON | ON | ON | ON | ON | OFF |
| SWITCH ELEMENT 34 | ON | OFF | OFF | OFF | OFF | OFF | OFF | OFF |

FIG. 14

| SWITCH ELEMENT | STATE | | | | | | | |
|---|---|---|---|---|---|---|---|---|
| | T1 | T2 | T3 | T4 | T5 | T6 | T7 | T8 |
| SWITCH ELEMENT 31 | ON | ON | OFF | OFF | OFF | OFF | OFF | ON |
| SWITCH ELEMENT 32 | OFF | OFF | OFF | OFF | ON | OFF | OFF | OFF |
| SWITCH ELEMENT 33 | OFF | OFF | OFF | ON | ON | ON | OFF | OFF |
| SWITCH ELEMENT 34 | ON | OFF | OFF | OFF | OFF | OFF | OFF | OFF |

DRIVE CIRCUIT

TECHNICAL FIELD

The present disclosure relates to a drive circuit.

BACKGROUND ART

A drive circuit driving a capacitive load is known. The capacitive load is, for example, a piezoelectric element including a piezoelectric substance and two electrodes sandwiching the piezoelectric substance. The capacitive load is used by being incorporated in various types of sound or vibration-generating equipment such as, for example, a game controller, a smartphone, a piezoelectric buzzer, and a liquid discharging device in an inkjet printer.

By the way, for increasing sound pressure during generation of sound and increasing amount of displacement during vibration, the capacitive load needs a large capacity. However, the capacitive load having a large capacity consumes large power, because electric energy accumulated in the capacitive load is also large and electric energy converted into thermal energy is also large. Thus, a technique for reducing power consumption by effectively using electric energy accumulated in the capacitive load is desired.

For example, Patent Literature 1 describes a liquid discharging device that includes a liquid discharging head discharging a droplet from a nozzle opening by use of pressure generated by displacement of a piezoelectric element. In order to reduce power consumed in a charge pump, the liquid discharging device transfers electric charge accumulated in the piezoelectric element that is a capacitive load to a capacitor included in the charge pump.

CITATION LIST

Patent Literature

Patent Literature 1: Japanese Patent No. 5083546

SUMMARY OF INVENTION

Technical Problem

However, the liquid discharging device described in Patent Literature 1 transfers electric charge accumulated in the piezoelectric element to the capacitor included in the charge pump over multiple stages. Thus, the liquid discharging device described in Patent Literature 1 is unable to efficiently use electric energy accumulated in the piezoelectric element, and cannot reduce much power consumption during driving of the capacitive load. Thus, a technique for reducing power consumption during driving of the capacitive load is desired.

The present disclosure has been made in view of the above problem, and an objective of the present disclosure is to reduce power consumption during driving of a capacitive load.

Solution to Problem

To solve the above problem, a drive circuit according to one embodiment of the present disclosure is a drive circuit for driving a capacitive load, and includes:

a bridge circuit including a plurality of switch elements and alternately applying a first voltage and a second voltage having mutually different polarities to the capacitive load;

a first rectifier element connected to one end of the capacitive load;

a second rectifier element connected to another end of the capacitive load;

an electric storage element connected to the first rectifier element and the second rectifier element; and a control circuit controlling the plurality of switch elements in such a way that electric charge stored in the capacitive load moves to the electric storage element via the first rectifier element when a voltage applied to the capacitive load transitions from the first voltage to the second voltage and electric charge stored in the capacitive load moves to the electric storage element via the second rectifier element when a voltage applied to the capacitive load transitions from the second voltage to the first voltage.

Advantageous Effects of Invention

According to a drive circuit having the above configuration, power consumption during driving of a capacitive load can be reduced.

BRIEF DESCRIPTION OF DRAWINGS

FIG. 2 is a diagram illustrating a switch switching sequence according to Embodiment 1;

FIG. 14 is a diagram illustrating a switch switching sequence according to Embodiment 4.

DESCRIPTION OF EMBODIMENTS

Hereinafter, a power transmission system according to embodiments of a technique according to the present disclosure is described with reference to the drawings. Note that, in the following embodiments, an identical component part is assigned an identical reference sign. Further, a size ratio and a shape of a component element illustrated in each drawing are not necessarily the same as in practice.

Embodiment 1

First, a configuration of a drive circuit 100 according to the present embodiment is described with reference to FIG. 1. The drive circuit 100 is a circuit AC-driving a capacitive load. In other words, the drive circuit 100 is a circuit alternately applying positive and negative voltages to a capacitive load. In the present embodiment, the capacitive load is a piezoelectric element including a piezoelectric substance and two electrodes sandwiching the piezoelectric substance. The piezoelectric element is used by being incorporated in various types of sound or vibration-generating equipment such as, for example, a game controller, a smartphone, a piezoelectric buzzer, and a liquid discharging device in an inkjet printer.

In general, electric energy accumulated in a capacitive load is converted into thermal energy for consumption. However, electric energy accumulated in a capacitive load is desirably used effectively as electric energy rather than consumed as thermal energy. In view of this, in the drive circuit 100 according to the present embodiment, electric energy accumulated in a capacitive load is stored in an electric storage element for use, thereby reducing power consumption as the entire drive circuit 100.

Figure 1:
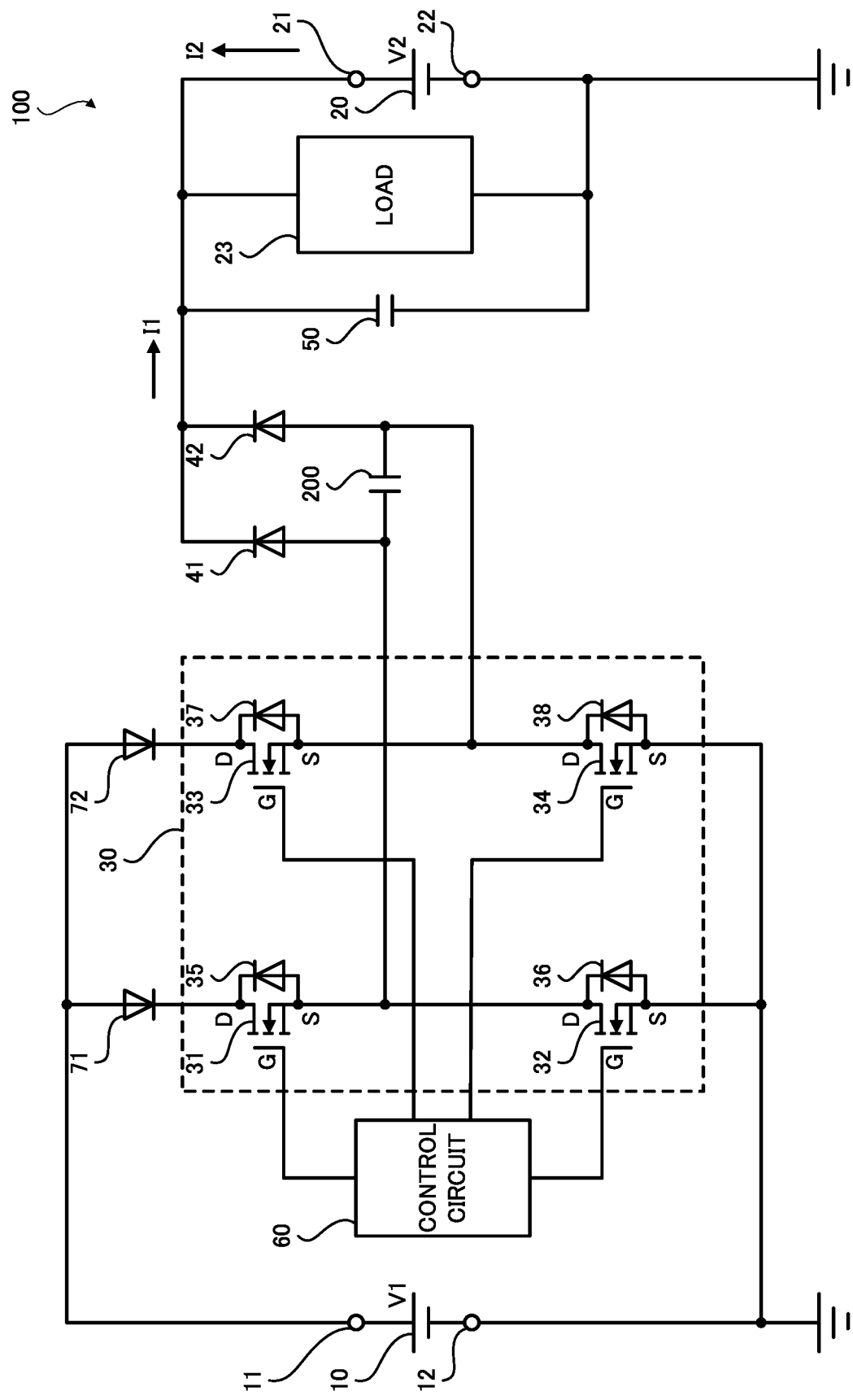
FIG. 1 is a circuit diagram of a drive circuit according to Embodiment 1.

As illustrated in FIG. 1, the drive circuit 100 includes a power source 10, a power source 20, a load 23, a bridge circuit 30, a diode 41, a diode 42, a capacitor 50, a control circuit 60, a diode 71, and a diode 72. A capacitor 200 to be driven by the drive circuit 100 corresponds to capacitance of the piezoelectric element that is a capacitive load.

The power source 10 is a power source supplying DC power. The power source 10 supplies power for driving the piezoelectric element. A power source voltage V1 of the power source 10 is a relatively high voltage. In the present embodiment, V1 is 15 V. The power source 10 includes a high potential side output terminal 11 and a low potential side output terminal 12. The high potential side output terminal 11 is an output terminal set to a potential higher than the low potential side output terminal 12. V1 is applied between the high potential side output terminal 11 and the low potential side output terminal 12. In the present embodiment, the high potential side output terminal 11 is set to V1, and the low potential side output terminal 12 is grounded and set to 0 V. The power source 10 is one example of a first power source.

The power source 20 is a power source provided separately from the power source 10, and is a power source supplying DC power. The power source 20 supplies power for driving the load 23. A power source voltage V2 of the power source 20 may be a voltage same as V1, or may be a voltage different from V1. In the present embodiment, V2 is 15 V, a voltage same as V1. The power source 20 includes a high potential side output terminal 21 and a low potential side output terminal 22. The high potential side output terminal 21 is an output terminal set to a potential higher than the low potential side output terminal 22. V2 is applied between the high potential side output terminal 21 and the low potential side output terminal 22. In the present embodiment, the high potential side output terminal 21 is set to V2, and the low potential side output terminal 22 is grounded and set to 0 V. The power source 20 is one example of a second power source.

The load 23 is a load receiving power supply from the power source 20, and is a load other than the piezoelectric element illustrated as the capacitor 200 in FIG. 1. Note that, the load 23 may be another piezoelectric element, or may be the control circuit 60. When the drive circuit 100 drives a plurality of piezoelectric elements, the another piezoelectric element is a piezoelectric element other than the piezoelectric element illustrated as the capacitor 200 in FIG. 1 among the plurality of piezoelectric elements.

The bridge circuit 30 supplies power supplied from the power source 10 to the capacitor 200. The bridge circuit 30 incudes a switch element 31, a switch element 32, a switch element 33, and a switch element 34, and is a circuit alternately applying a first voltage and a second voltage having mutually different polarities to the capacitor 200 that is a capacitive load. The bridge circuit 30 is controlled by the control circuit 60. In the present embodiment, the switch element 31, the switch element 32, the switch element 33, and the switch element 34 are negative (n)-channel metal-oxide-semiconductor field effect transistors (MOSFETs). The switch element 31, the switch element 32, the switch element 33, and the switch element 34 are controlled by gate drive signals supplied from the control circuit 60.

The switch element 31 is connected between the high potential side output terminal 11 of the power source 10 and one end of the capacitor 200. The switch element 32 is connected between the low potential side output terminal 12 of the power source 10 and the one end of the capacitor 200. The switch element 33 is connected between the high potential side output terminal 11 of the power source 10 and another end of the capacitor 200. The switch element 34 is connected between the low potential side output terminal 12 of the power source 10 and the another end of the capacitor 200.

The switch element 31 includes a parasitic diode 35 through which electric current flows from a source of the switch element 31 toward a drain of the switch element 31. The switch element 32 incudes a parasitic diode 36 through which electric current flows from a source of the switch element 32 toward a drain of the switch element 32. The switch element 33 includes a parasitic diode 37 through which electric current flows from a source of the switch element 33 toward a drain of the switch element 33. The switch element 34 includes a parasitic diode 38 through which electric current flows from a source of the switch element 34 toward a drain of the switch element 34. The switch element 31 is one example of a first switch element. The switch element 32 is one example of a second switch element. The switch element 33 is one example of a third switch element. The switch element 34 is one example of a fourth switch element.

The diode 41 is a rectifier element connected to the one end of the capacitor 200 that is a capacitive load. The diode 42 is a rectifier element connected to the another end of the capacitor 200 that is a capacitive load. The diode 41 and the diode 42 take a role of supplying electric charge accumulated in the capacitor 200 to the capacitor 50 that is an electric storage element. The diode 41 is one example of a first rectifier element. The diode 42 is one example of a second rectifier element.

The capacitor 50 is an electric storage element connected to the diode 41 and the diode 42. The capacitor 50 is connected in parallel to the load 23 when seen from the power source 20. The capacitor 50 takes a role of temporarily accumulating electric charge supplied from the capacitor 200 that is a capacitive load, and supplying the accumulated electric charge to the load 23. While the capacitor 50 supplies electric charge to the load 23, the power source 20 supplies less electric charge to the load 23, and power consumption of the power source 20 is reduced. The capacitor 50 preferably has an electrostatic capacity equal to or more than an electrostatic capacity of the capacitor 200. In the present embodiment, the capacitor 50 has an electrostatic capacity ten times more than an electrostatic capacity of the capacitor 200. In this case, when the capacitor 50 is charged with electric charge supplied from the capacitor 200, a voltage between both ends of the capacitor 50 is prevented from excessively rising. The capacitor 50 is one example of an electric storage element.

The control circuit 60 controls the bridge circuit 30 in such a way that a first voltage and a second voltage are applied to the capacitor 200. The control circuit 60 controls the bridge circuit 30 by supplying a gate drive signal to each of the switch element 31, the switch element 32, the switch element 33, and the switch element 34. The first voltage is a voltage a little lower than V1. The second voltage is a voltage as large as the first voltage, and is a voltage having a polarity reverse to the first voltage. In the present embodiment, the first voltage is a positive voltage, and the second voltage is a negative voltage.

Note that, in the present embodiment, applying a voltage to the capacitor 200 in such a way that a potential at the one end of the capacitor 200 becomes higher than a potential at the another end of the capacitor 200 is referred to as applying a positive voltage to the capacitor 200. Further, applying a voltage to the capacitor 200 in such a way that a potential at the one end of the capacitor 200 becomes lower than a potential at the another end of the capacitor 200 is referred to as applying a negative voltage to the capacitor 200. Further, applying a positive voltage to the capacitor 200 is referred to as driving the capacitor 200 in a positive direction, and applying a negative voltage to the capacitor 200 is referred to as driving the capacitor 200 in a negative direction.

Herein, the first voltage is applied to the capacitor 200 when the bridge circuit 30 is in a first state, and the second voltage is applied to the capacitor 200 when the bridge circuit 30 is in a second state. The first state is a state in which a first pair, a pair of the switch element 31 and the switch element 34, is turned on and a second pair, a pair of the switch element 32 and the switch element 33, is turned off. The second state is a state in which the first pair is turned off and the second pair is turned on. Note that, conducting electric current between a drain and a source is referred to as turning on, and not conducting electric current between a drain and a source is referred to as turning off.

In a control of the bridge circuit 30 in general, each switch element is AC-driven in such a way that the first pair and the second pair are repeatedly turned on and off alternately. Note that, the control of the bridge circuit 30 in general is a control in which electric energy accumulated in the capacitor 200 is not used but is consumed as thermal energy. When the capacitive load is a piezoelectric buzzer, a musical scale of sound to be output is adjusted by adjusting a frequency of a gate drive signal. For example, when a pulse frequency modulated (PFM) signal is used as a gate drive signal, various types of music are reproducible. The switch element is turned on when the PFM gate drive signal is at an H level, and the switch element is turned off when the PFM gate drive signal is at an L level.

In the present embodiment, the switch elements are n-channel MOSFETs. Accordingly, the switch element is turned on when a gate voltage is higher than a source voltage by a gate threshold voltage or more. For example, when turning on the switch element 31, the control circuit 60 supplies, to a gate of the switch element 31, a gate drive signal having a voltage (for example, V1) higher than a source voltage of the switch element 31 by a gate threshold voltage or more. Further, when turning on the switch element 32, the control circuit 60 supplies, to a gate of the switch element 32, a gate drive signal having a voltage (for example, 3 V) higher than a source voltage 0 V of the switch element 32 by a gate threshold voltage or more.

Herein, when the bridge circuit 30 is controlled in such a way that the first state and the second state are repeated, electric energy accumulated in the capacitor 200 is not used but is consumed as thermal energy. In view of this, in the present embodiment, the control circuit 60 provides an intermediate state between the first state and the second state in order that electric charge accumulated in the capacitor 200 is used after being moved to the capacitor 50.

Specifically, the control circuit 60 controls the switch element 31, the switch element 32, the switch element 33, and the switch element 34 in such a way that electric charge stored in the capacitor 200 moves to the capacitor 50 via the diode 41 when a voltage applied to the capacitor 200 transitions from the first voltage to the second voltage and electric charge stored in the capacitor 200 moves to the capacitor 50 via the diode 42 when a voltage applied to the capacitor 200 transitions from the second voltage to the first voltage.

The diode 71 and the diode 72 are rectifier elements preventing reverse flow of electric current from the capacitor 200 to the power source 10 via the bridge circuit 30. The diode 71 prevents flow of electric charge from the capacitor 200 to the power source 10 via the switch element 31. The diode 72 prevents flow of electric charge from the capacitor 200 to the power source 10 via the switch element 33. The diode 71 and the diode 72 are one example of a rectifier element.

Next, a sequence of switching each switch element by the control circuit 60 is described with reference to FIGS. 2 and 3. FIG. 2 illustrates a switch switching sequence according to the present embodiment. As illustrated in FIG. 2, in the present embodiment, a state of each switch element is switched in such a way that a term T1, a term T2, a term T3, a term T4, a term T5, a term T6, a term T7, and a term T8 arrive repeatedly in sequence.

The term T1 is a term in which the switch element 31 and the switch element 34 are turned on and the switch element 32 and the switch element 33 are turned off. The term T2 is a term in which the switch element 31 is turned on and the switch element 32, the switch element 33, and the switch element 34 are turned off. The term T3 is a term in which the switch element 31 and the switch element 33 are turned on and the switch element 32 and the switch element 34 are turned off. The term T4 is a term in which the switch element 33 is turned on and the switch element 31, the switch element 32, and the switch element 34 are turned off.

The term T5 is a term in which the switch element 32 and the switch element 33 are turned on and the switch element 31 and the switch element 34 are turned off. The term T6 is a term in which the switch element 33 is turned on and the switch element 31, the switch element 32, and the switch element 34 are turned off. The term T7 is a term in which the switch element 31 and the switch element 33 are turned on and the switch element 32 and the switch element 34 are turned off. The term T8 is a term in which the switch element 31 is turned on and the switch element 32, the switch element 33, and the switch element 34 are turned off.

Figure 3:
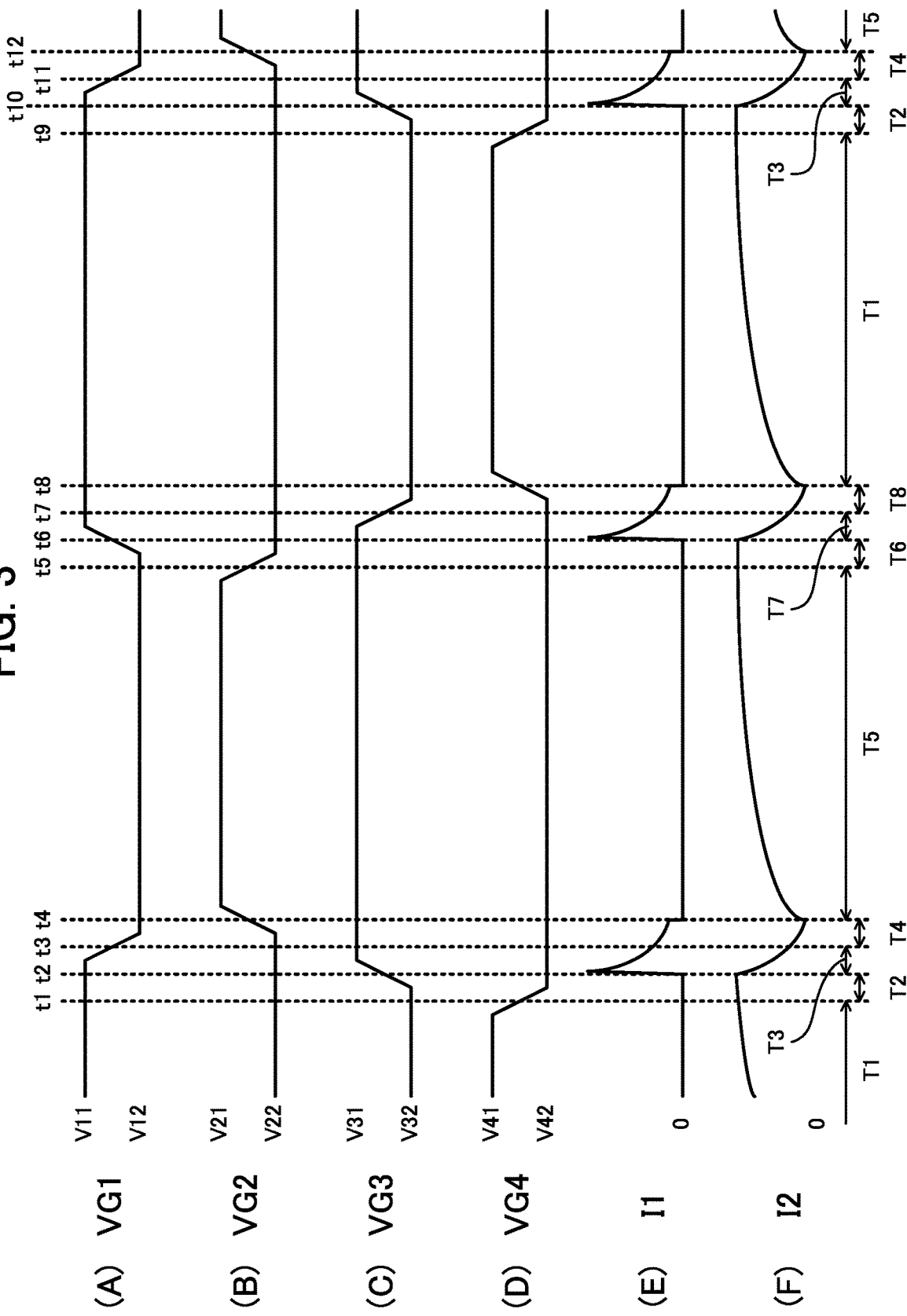
FIG. 3 is a diagram illustrating a temporal change of a signal in each part of the drive circuit according to Embodiment 1, (A) is a diagram illustrating a temporal change of VG1, (B) is a diagram illustrating a temporal change of VG2, (C) is a diagram illustrating a temporal change of VG3, (D) is a diagram illustrating a temporal change of VG4, (E) is a diagram illustrating a temporal change of I1, and (F) is a diagram illustrating a temporal change of I2.

FIG. 3 illustrates a timing chart illustrating a temporal change of a signal in each part of the drive circuit 100 according to the present embodiment. Section (A) of FIG. 3 illustrates a voltage waveform illustrating a temporal change of a gate voltage VG1 of the switch element 31. Section (B) of FIG. 3 illustrates a voltage waveform illustrating a temporal change of a gate voltage VG2 of the switch element 32. Section (C) of FIG. 3 illustrates a voltage waveform illustrating a temporal change of a gate voltage VG3 of the switch element 33. Section (D) of FIG. 3 illustrates a voltage waveform illustrating a temporal change of a gate voltage VG4 of the switch element 34. Section (E) of FIG. 3 illustrates a current waveform illustrating a temporal change of an electric current I1 flowing from the capacitor 200 to the capacitor 50. Section (F) of FIG. 3 illustrates a current waveform illustrating a temporal change of an electric current I2 output by the power source 20.

A term before t1 is T1. A term from t1 to t2 is T2. A term from t2 to t3 is T3. A term from t3 to t4 is T4. A term from t4 to t5 is T5. A term from t5 to t6 is T6. A term from t6 to t7 is T7. A term from t7 to t8 is T8. A term from t8 to t9 is T1. A term from t9 to t10 is 2. A term from t10 to t11 is T3. A term from t11 to t12 is T4. A term after t12 is T5.

Before t1, the control circuit 60 supplies a gate drive signal for turning on the switch element 31 to the gate of the switch element 31, supplies a gate drive signal for turning off the switch element 32 to the gate of the switch element 32, supplies a gate drive signal for turning off the switch element 33 to a gate of the switch element 33, and supplies a gate drive signal for turning on the switch element 34 to a gate of the switch element 34. V11 is a gate voltage for turning on the switch element 31, and V12 is a gate voltage for turning off the switch element 31. V21 is a gate voltage for turning on the switch element 32, and V22 is a gate voltage for turning off the switch element 32. V31 is a gate voltage for turning on the switch element 33, and V32 is a gate voltage for turning off the switch element 33. V41 is a gate voltage for turning on the switch element 34, and V42 is a gate voltage for turning off the switch element 34. For example, V11 and V31 are V1, V21 and V41 are 3 V, and V12, V22, V32, and V42 are 0 V.

First, at t1, the control circuit 60 supplies a gate drive signal for turning off the switch element 34 to the gate of the switch element 34. Next, at t2, the control circuit 60 supplies a gate drive signal for turning on the switch element 33 to the gate of the switch element 33. At t2, electric charge accumulated in the capacitor 200 moves to the capacitor 50, and I1 rapidly increases. Further, after t2, electric charge supplied from the power source 20 to the load 23 decreases due to supply of electric charge from the capacitor 50 to the load 23, and I2 decreases.

At t3, the control circuit 60 supplies a gate drive signal for turning off the switch element 31 to the gate of the switch element 31. At t4, the control circuit 60 supplies a gate drive signal for turning on the switch element 32 to the gate of the switch element 32. After t4, electric charge no longer moves from the capacitor 200 to the capacitor 50, and I1 becomes substantially 0. Further, after t4, electric charge supplied from the power source 20 to the load 23 increases due to decrease of electric charge supplied from the capacitor 50 to the load 23, and I2 increases.

At t5, the control circuit 60 supplies a gate drive signal for turning off the switch element 32 to the gate of the switch element 32. Next, at t6, the control circuit 60 supplies a gate drive signal for turning on the switch element 31 to the gate of the switch element 31. At t6, electric charge accumulated in the capacitor 200 moves to the capacitor 50, and I1 rapidly increases. Further, after t6, electric charge supplied from the power source 20 to the load 23 decreases due to supply of electric charge from the capacitor 50 to the load 23, and I2 decreases.

At t7, the control circuit 60 supplies a gate drive signal for turning off the switch element 33 to the gate of the switch element 33. At t8, the control circuit 60 supplies a gate drive signal for turning on the switch element 34 to the gate of the switch element 34. After t8, electric charge no longer moves from the capacitor 200 to the capacitor 50, and I1 becomes substantially 0. Further, after t8, electric charge supplied from the power source 20 to the load 23 increases due to decrease of electric charge supplied from the capacitor 50 to the load 23, and I2 increases. Thereafter, the control circuit 60 repeats a switch control executed from t1 to t8.

As described above, the control circuit 60 moves electric charge stored in the capacitor 200 to the capacitor 50 via the diode 41 by turning off the switch element 31 and turning on the switch element 33 between turning off the switch element 34 and turning on the switch element 32 when switching a state of the bridge circuit 30 from the first state to the second state. Further, the control circuit 60 moves electric charge stored in the capacitor 200 to the capacitor 50 via the diode 42 by turning on the switch element 31 and turning off the switch element 33 between turning off the switch element 32 and turning on the switch element 34 when switching a state of the bridge circuit 30 from the second state to the first state.

Next, an operation of the drive circuit 100 is described in detail with reference to FIGS. 4 to 11.

Figure 4:
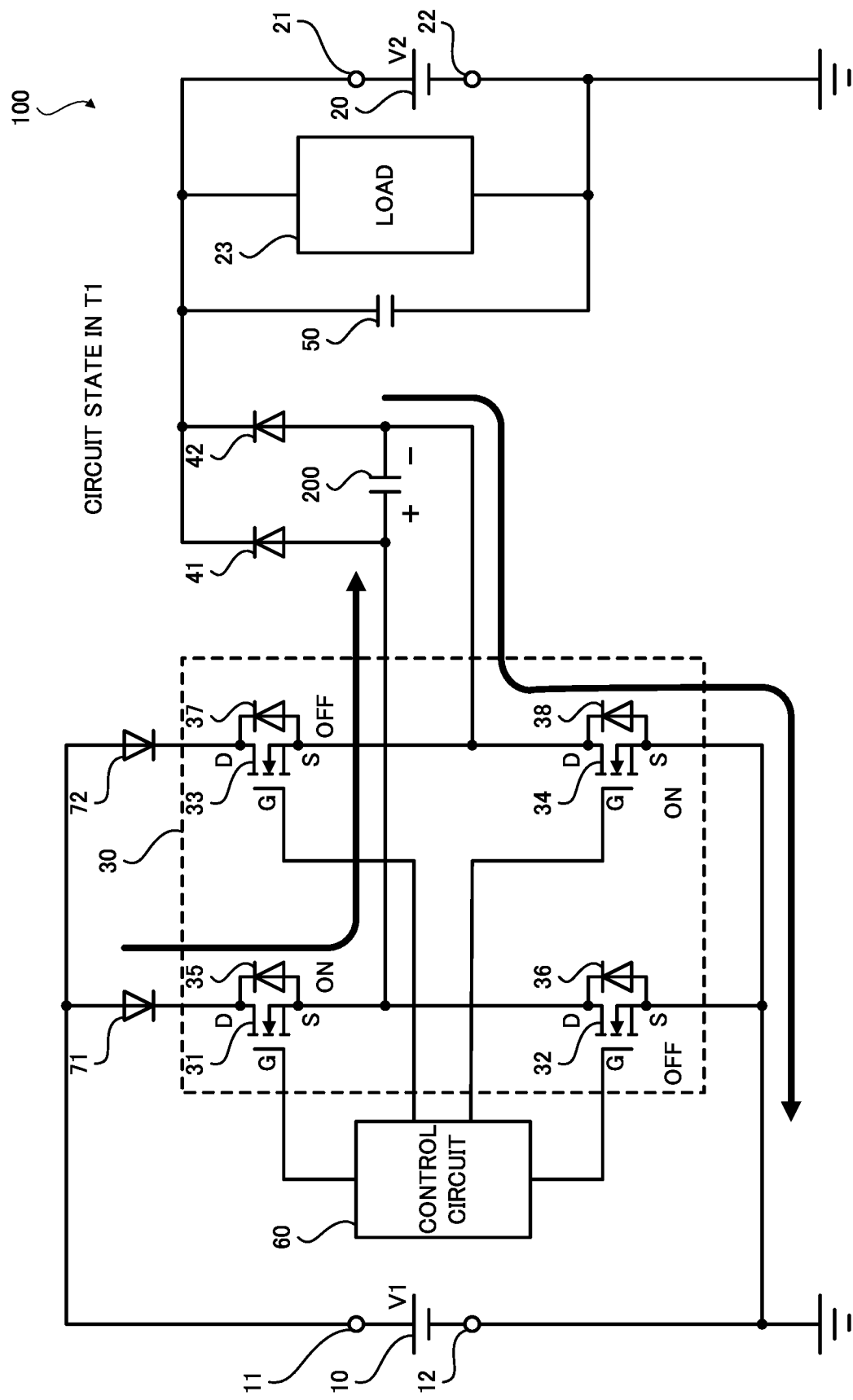
FIG. 4 is a diagram illustrating a circuit state in T1.

First, an operating state of the drive circuit 100 in the term T1 is described with reference to FIG. 4. In the term T1, the control circuit 60 turns on the switch element 31 and the switch element 34 and turns off the switch element 32 and the switch element 33. In the term T1, electric charge flows from the high potential side output terminal 11 of the power source 10 to the one end of the capacitor 200 via the switch element 31, and electric charge flows from the another end of the capacitor 200 to the low potential side output terminal 12 of the power source 10 via the switch element 34. In other words, in the term T1, the capacitor 200 is driven in a positive direction.

Note that, the diode 42 for reverse flow prevention is connected between the another end of the capacitor 200 and the high potential side output terminal 21 of the power source 20. Because the diode 42 is present, electric current is prevented from flowing from the high potential side output terminal 21 of the power source 20 to the low potential side output terminal 12 of the power source 10 via the switch element 34, even when the switch element 34 is turned on. In other words, the diode 42 prevents a short circuit. Note that, in a term prior to T1, the capacitor 50 may be insufficiently charged and a voltage between both ends of the capacitor 50 may be less than V1 in some cases. In this case, in the term T1, electric current flows from the power source 10 to the capacitor 50 via the diode 71, the switch element 31, and the diode 41, and the capacitor 50 is charged in such a way that a voltage between both ends of the capacitor 50 becomes substantially V1.

Figure 5:
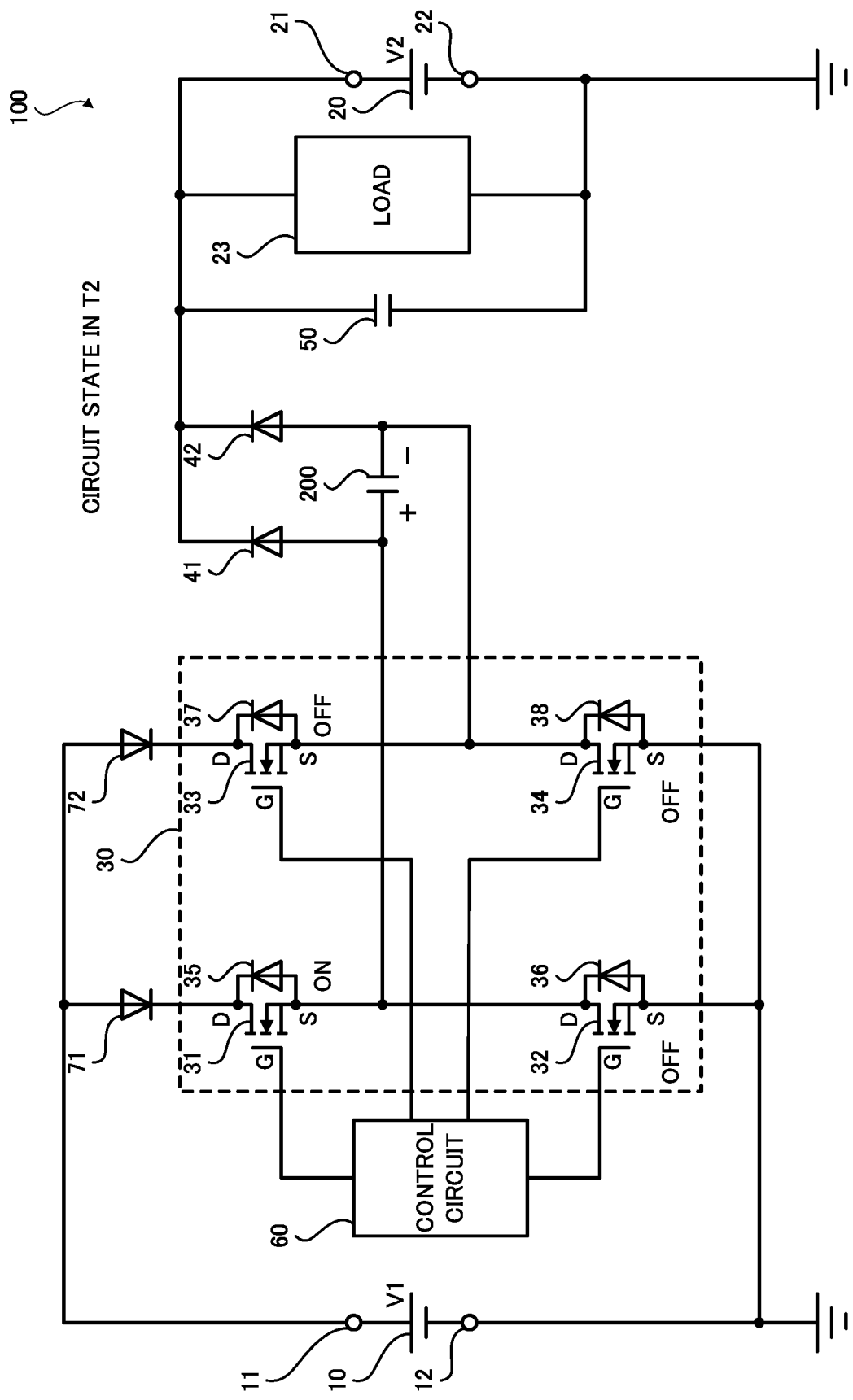
FIG. 5 is a diagram illustrating a circuit state in T2.

Next, an operating state of the drive circuit 100 in the term T2 is described with reference to FIG. 5. In the term T2, the control circuit 60 turns on the switch element 31 and turns off the switch element 32, the switch element 33, and the switch element 34. The term T2 is a term immediately after switching the switch element 34 from on to off, and is a term immediately after end of driving the capacitor 200 in a positive direction. In the term T2, the capacitor 200 sustains a state of storing electric charge, and a voltage between both ends of the capacitor 200 is kept at substantially V1.

Figure 6:
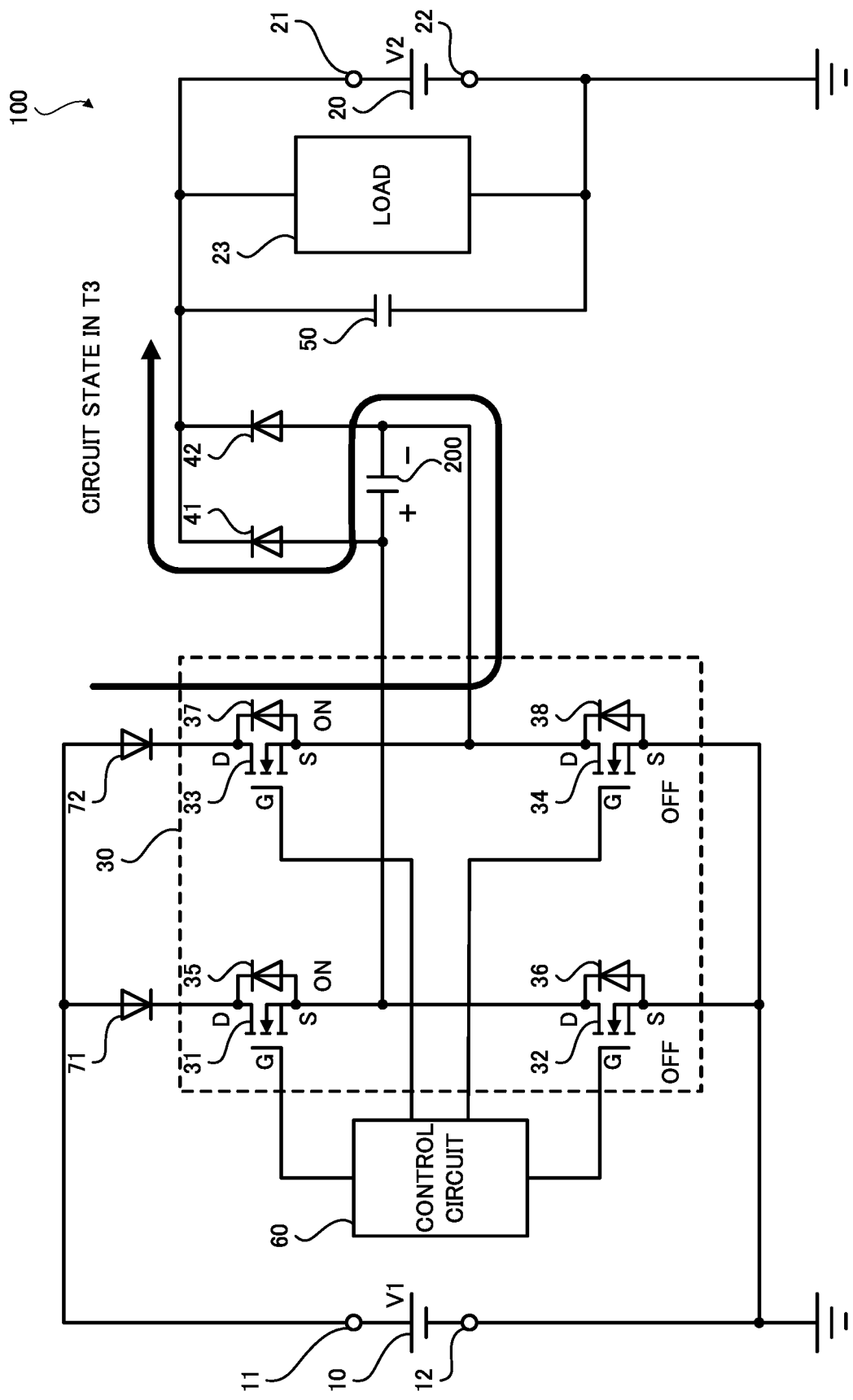
FIG. 6 is a diagram illustrating a circuit state in T3.

Next, an operating state of the drive circuit 100 in the term T3 is described with reference to FIG. 6. In the term T3, the control circuit 60 turns on the switch element 31 and the switch element 33 and turns off the switch element 32 and the switch element 34. The term T3 is a term immediately after turning on the switch element 33. Accordingly, in the term T3, electric current flows from the power source 10 to the another end of the capacitor 200 via the diode 72 and the switch element 33. Thus, the potential at the another end of the capacitor 200 rises from substantially 0 V to a potential between V1 and Vf2. Vf2 is a forward voltage of the diode 72.

At this time, the potential at the one end of the capacitor 200 also rises with the rise of the potential at the another end of the capacitor 200. Thus, electric charge is discharged from the one end of the capacitor 200 to the capacitor 50 by electric conduction of the diode 41. Note that, because the diode 71 for reverse flow prevention is present on a path linking between the one end of the capacitor 200 and the high potential side output terminal 11 of the power source 10, no electric charge flows from the one end of the capacitor 200 to the power source 10.

Figure 7:
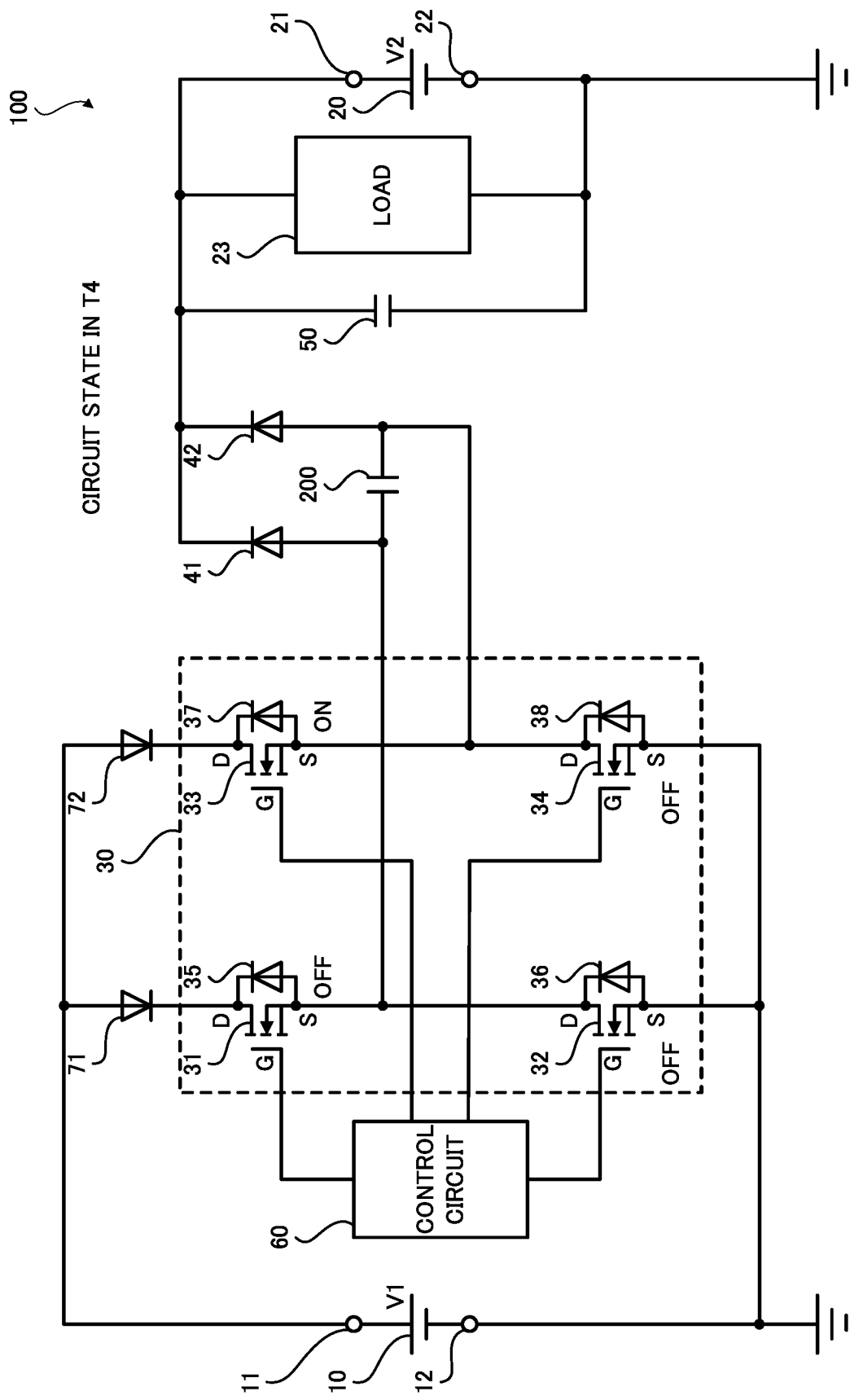
FIG. 7 is a diagram illustrating a circuit state in T4.

Next, an operating state of the drive circuit 100 in the term T4 is described with reference to FIG. 7. In the term T4, the control circuit 60 turns on the switch element 33 and turns off the switch element 31, the switch element 32, and the switch element 34. In the term T4, similarly to the term T3, electric charge stored in the capacitor 200 is discharged to the capacitor 50 via the diode 41. When discharging is completed in the term T3, no electric charge is discharged in the term T4.

A sum of the term T3 and the term T4 is preferably adjusted to discharge time that is time required to discharge electric charge stored in the capacitor 200 to the capacitor 50. Herein, the term T2 may be an extremely short term. Thus, in the present embodiment, amount of increase in time required for switching from the first state to the second state is only the discharge time, in comparison with a general control involving no electric storage in the capacitor 50. The discharge time is determined according to, for example, a conduction speed of the diode 41, the diode 72, and the switch element 33 and a transient response characteristic of the power source 10, the capacitor 50, and the capacitor 200 on a path through which electric charge flows.

Figure 8:
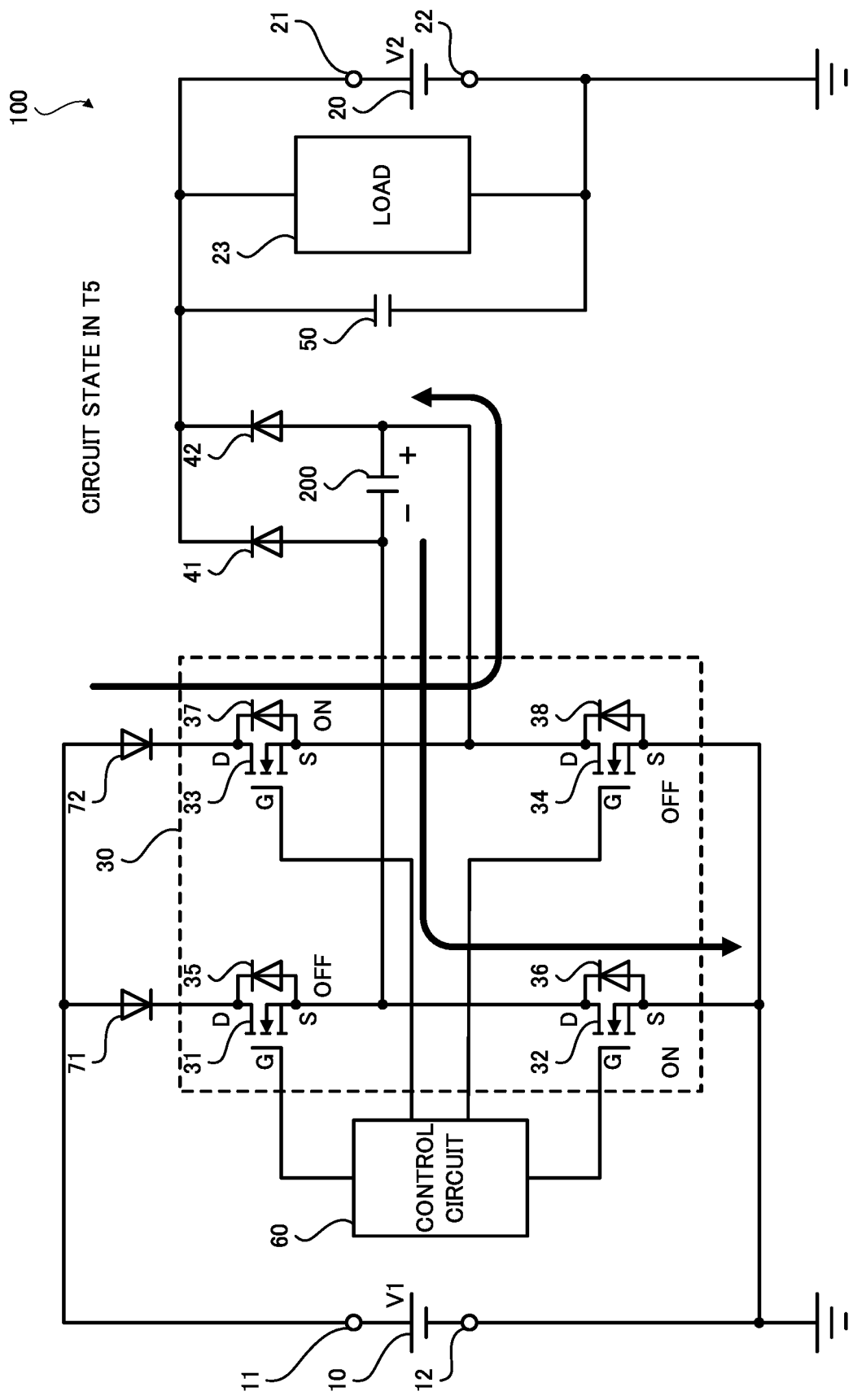
FIG. 8 is a diagram illustrating a circuit state in T5.

Next, an operating state of the drive circuit 100 in the term T5 is described with reference to FIG. 8. In the term T5, the control circuit 60 turns on the switch element 32 and the switch element 33 and turns off the switch element 31 and the switch element 34. In the term T5, electric charge flows from the high potential side output terminal 11 of the power source 10 to the another end of the capacitor 200 via the switch element 33, and electric charge flows from the one end of the capacitor 200 to the low potential side output terminal 12 of the power source 10 via the switch element 32. In other words, in the term T5, the capacitor 200 is driven in a negative direction.

Note that, the diode 41 for reverse flow prevention is connected between the one end of the capacitor 200 and the high potential side output terminal 21 of the power source 20. Because the diode 41 is present, electric current is prevented from flowing from the high potential side output terminal 21 of the power source 20 to the low potential side output terminal 12 of the power source 10 via the switch element 32, even when the switch element 32 is turned on. In other words, the diode 41 prevents a short circuit. Note that, in a term prior to T5, the capacitor 50 may be insufficiently charged and a voltage between both ends of the capacitor 50 may be less than V1 in some cases. In this case, in the term T5, electric current flows from the power source 10 to the capacitor 50 via the diode 72, the switch element 33, and the diode 42, and the capacitor 50 is charged in such a way that a voltage between both ends of the capacitor 50 becomes substantially V1.

Figure 9:
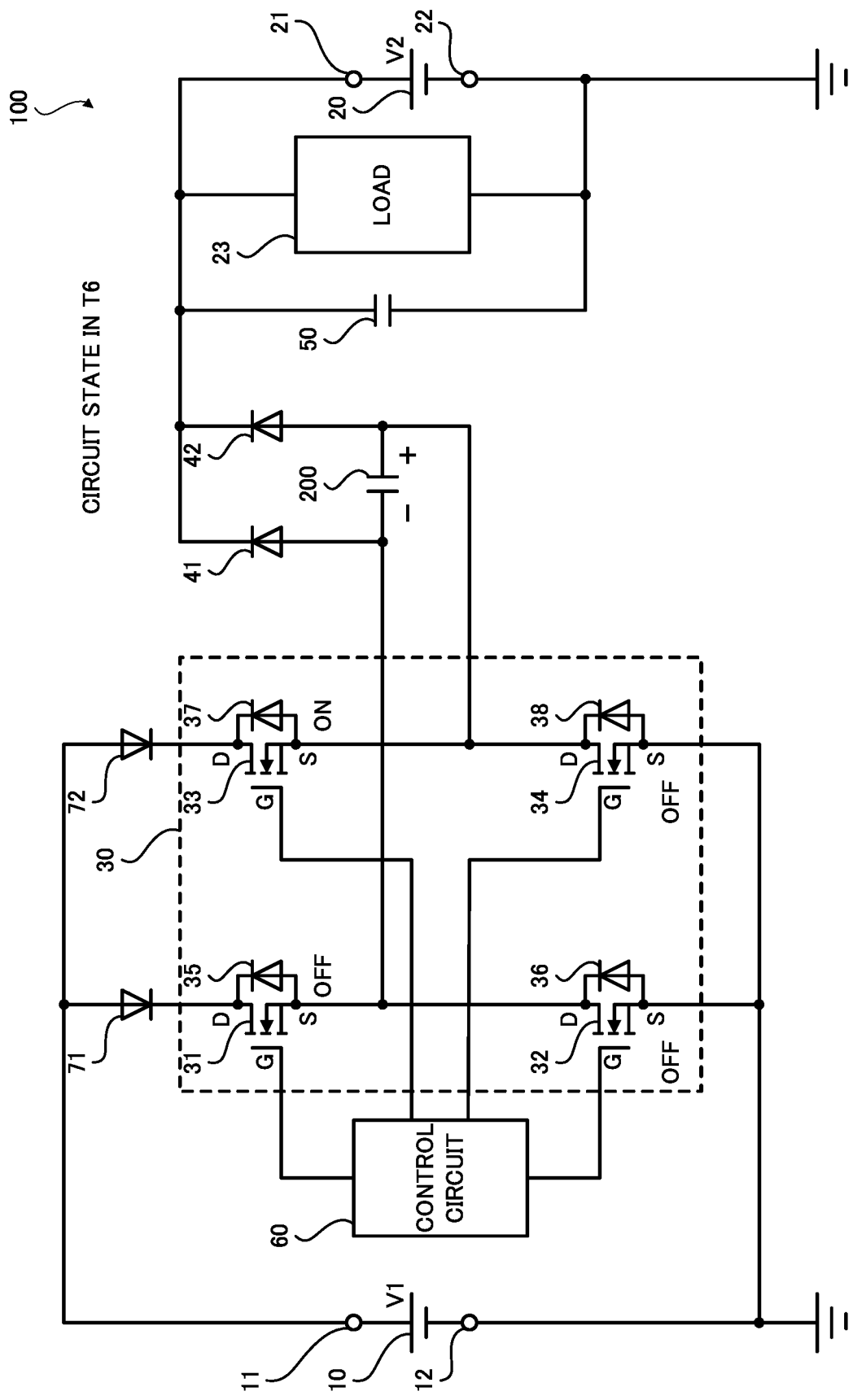
FIG. 9 is a diagram illustrating a circuit state in T6.

Next, an operating state of the drive circuit 100 in the term T6 is described with reference to FIG. 9. In the term T6, the control circuit 60 turns on the switch element 33 and turns off the switch element 31, the switch element 32, and the switch element 34. The term T6 is a term immediately after switching the switch element 32 from on to off, and is a term immediately after end of driving the capacitor 200 in a negative direction. In the term T6, the capacitor 200 sustains a state of storing electric charge, and a voltage between both ends of the capacitor 200 is kept at substantially V1.

Figure 10:
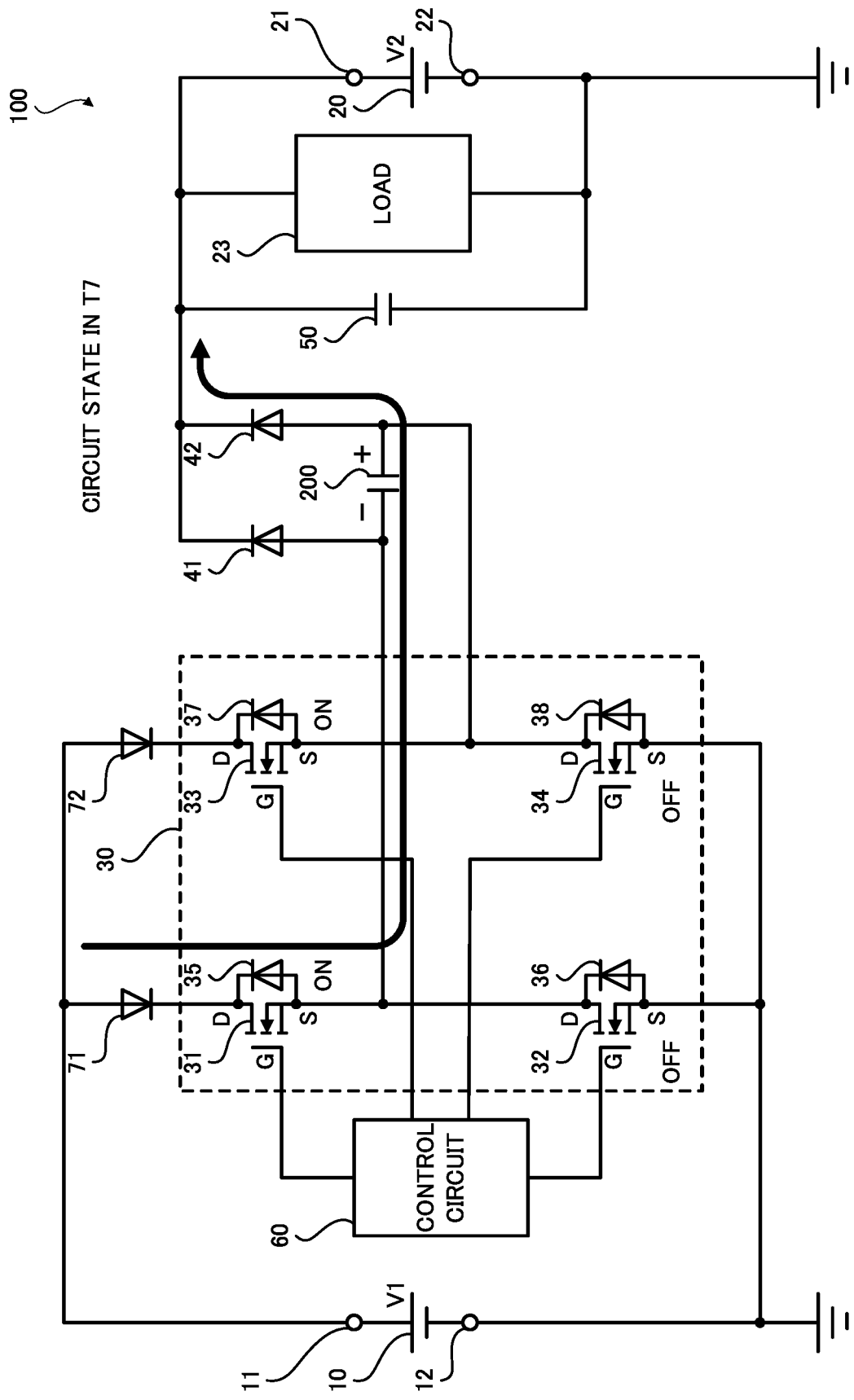
FIG. 10 is a diagram illustrating a circuit state in T7.

Next, an operating state of the drive circuit 100 in the term T7 is described with reference to FIG. 10. In the term T7, the control circuit 60 turns on the switch element 31 and the switch element 33 and turns off the switch element 32 and the switch element 34. The term T7 is a term immediately after turning on the switch element 31. Accordingly, in the term T7, electric current flows from the power source 10 to the one end of the capacitor 200 via the diode 71 and the switch element 31. Thus, the potential at the one end of the capacitor 200 rises from substantially 0 V to a potential between V1 and Vf2.

At this time, the potential at the another end of the capacitor 200 also rises with the rise of the potential at the one end of the capacitor 200. Thus, electric charge is discharged from the another end of the capacitor 200 to the capacitor 50 by electric conduction of the diode 42. Note that, because the diode 72 for reverse flow prevention is present on a path linking between the another end of the capacitor 200 and the high potential side output terminal 11 of the power source 10, no electric charge flows from the another end of the capacitor 200 to the power source 10.

Figure 11:
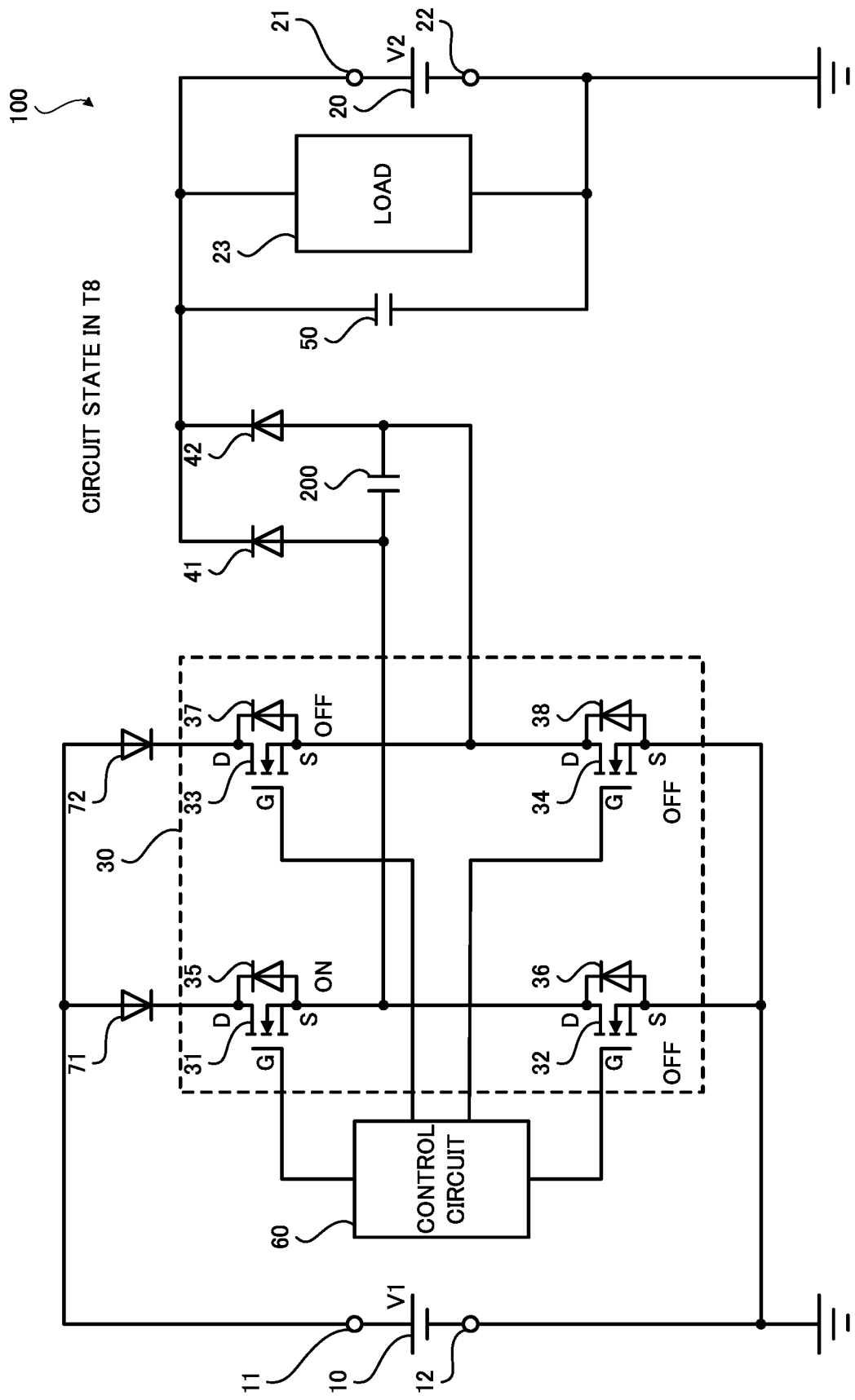
FIG. 11 is a diagram illustrating a circuit state in T8.

Next, an operating state of the drive circuit 100 in the term T8 is described with reference to FIG. 11. In the term T8, the control circuit 60 turns on the switch element 31 and turns off the switch element 32, the switch element 33, and the switch element 34. In the term T8, similarly to the term T7, electric charge stored in the capacitor 200 is discharged to the capacitor 50 via the diode 42. When discharging is completed in the term T7, no electric charge is discharged in the term T8.

A sum of the term T7 and the term T8 is preferably adjusted to discharge time that is time required to discharge electric charge stored in the capacitor 200 to the capacitor 50. Herein, the term T6 may be an extremely short term. Thus, in the present embodiment, amount of increase in time required for switching from the second state to the first state is only the discharge time, in comparison with a general control involving no electric storage in the capacitor 50. The discharge time is determined according to, for example, a conduction speed of the diode 42, the diode 71, and the switch element 31 and a transient response characteristic of the power source 10, the capacitor 50, and the capacitor 200 on a path through which electric charge flows.

As described above, in the present embodiment, the bridge circuit 30 is controlled in such a way that electric charge stored in the capacitor 200 moves to the capacitor 50 via the diode 41 or the diode 42 when a polarity of a voltage applied to the capacitor 200 transitions. Accordingly, according to the present embodiment, electric energy stored in the capacitor 200 can be used, and thus, power consumption during driving of the capacitor 200 can be reduced.

Further, in the present embodiment, the power source 20 for driving another load 23 is prepared separately from the power source 10 for driving the bridge circuit, and the capacitor 50 is connected in parallel to the power source 20 and the load 23. Accordingly, according to the present embodiment, electric energy stored in the capacitor 200 can be used by the power source 20, and power consumption of the power source 20 can be reduced.

Further, in the present embodiment, the diode 71 and the diode 72 for preventing reverse flow of electric current from the capacitor 200 to the power source 10 are provided. Accordingly, according to the present embodiment, electric energy stored in the capacitor 200 is prevented from being consumed as thermal energy by a short circuit.

Further, in the present embodiment, when a state of the bridge circuit 30 is switched between the first state and the second state, the switch element 31, the switch element 32, the switch element 33, and the switch element 34 are not simultaneously switched, but are switched in appropriate order. Accordingly, according to the present embodiment, when a state of the bridge circuit 30 is switched, electric charge stored in the capacitor 200 can be appropriately moved to the capacitor 50.

Embodiment 2

In Embodiment 1, an example has been described in which a power source voltage V1 of the power source 10 is the same as a power source voltage V2 of the power source 20. V1 and V2 may be different. In the present embodiment, a drive circuit 110 applicable to a case in which V1 is higher than V2 is described. Note that, configurations and processing similar to Embodiment 1 are not described or simply described.

Figure 12:
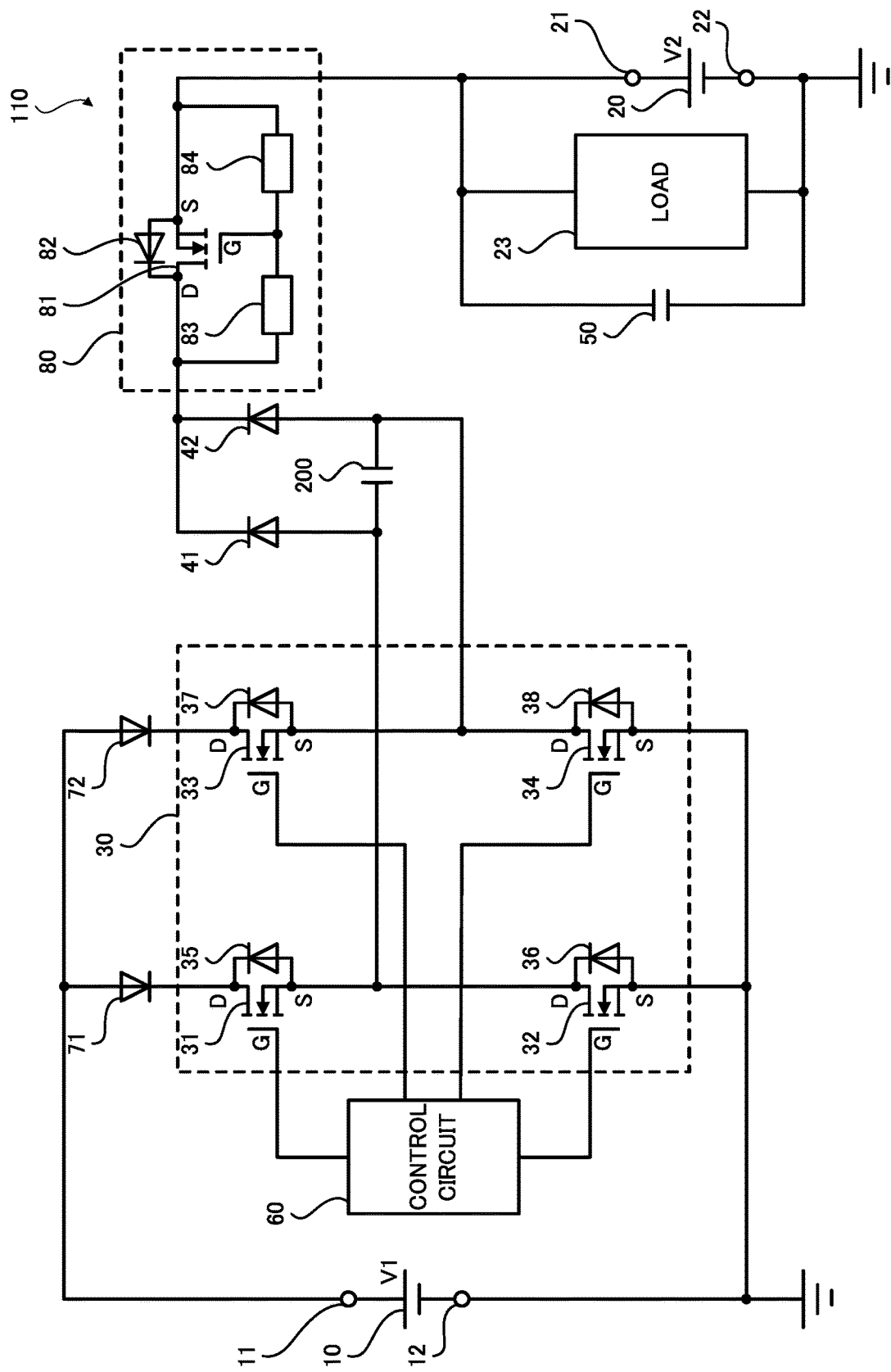
FIG. 12 is a circuit diagram of a drive circuit according to Embodiment 2.

Hereinafter, a configuration of the drive circuit 110 according to the present embodiment is described with reference to FIG. 12. The drive circuit 110 is different from the drive circuit 100 in that the drive circuit 110 includes a step-down circuit 80. The step-down circuit 80 is a circuit stepping down a voltage. The step-down circuit 80 is a circuit appropriately connecting, by converting V1 into V2, between a circuit operated by a power source 10 and a circuit operated by a power source 20. In the present embodiment, V1 is 15 V and V2 is 5 V.

The step-down circuit 80 is provided between a diode 41 and a diode 42 connected to a capacitor 200 and a parallel circuit including the power source 20, a load 23, and a capacitor 50. The step-down circuit 80 includes a switch element 81, a resistor 83, and a resistor 84.

The switch element 81 steps down a voltage applied to an input terminal according to a voltage applied to a control terminal, and applies the acquired stepped-down voltage to an output terminal. In the present embodiment, the switch element 81 is an n-channel MOSFET. The switch element 81 includes a parasitic diode 82 through which electric current flows from a source of the switch element 81 toward a drain of the switch element 81. The resistor 83 and the resistor 84 are resistors for adjusting a gate voltage of the switch element 81. A resistance value of the resistor 83 and a resistance value of the resistor 84 are determined according to V1 and V2.

The drain of the switch element 81 is connected to a cathode of the diode 41, a cathode of the diode 42, and one end of the resistor 83. The source of the switch element 81 is connected to a high potential side output terminal 21 of the power source 20, one end of the load 23, one end of the capacitor 50, and one end of the resistor 84. A gate of the switch element 81 is connected to another end of the resistor 83 and another end of the resistor 84.

When a state of a bridge circuit 30 changes from the first state to the second state, electric charge accumulated in the capacitor 200 is supplied to the capacitor 50 via the diode 41 and the step-down circuit 80. Further, when a state of the bridge circuit 30 changes from the second state to the first state, electric charge accumulated in the capacitor 200 is supplied to the capacitor 50 via the diode 42 and the step-down circuit 80. A voltage applied to the power source 20, the load 23, the capacitor 50, and the like via the step-down circuit 80 is a stepped-down voltage. Accordingly, a voltage exceeding a rated voltage is prevented from being applied to the power source 20, the load 23, the capacitor 50, and the like.

In the present embodiment, the diode 41 and the diode 42 are connected to the capacitor 50 via the step-down circuit. Accordingly, according to the present embodiment, even when a power source voltage of the power source 10 used for driving a capacitive load is different from a power source voltage of the power source 20 used for driving another load 23, electric energy accumulated in the capacitive load can be appropriately used by the power source 20.

Embodiment 3

Figure 13:
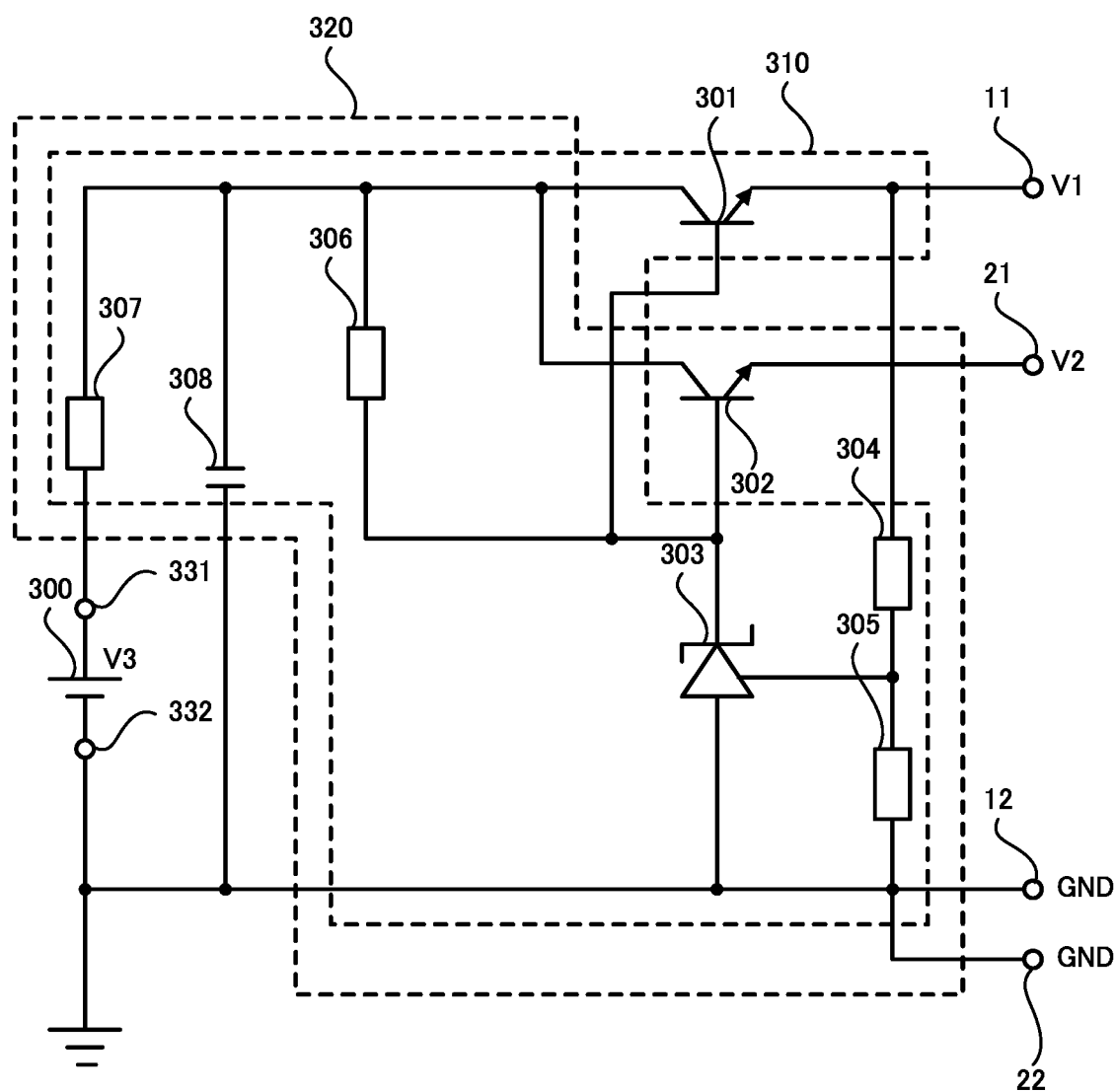
FIG. 13 is a circuit diagram of a first voltage converter circuit and a second voltage converter circuit according to Embodiment 3.

In Embodiments 1 and 2, an example has been described in which the power source 10 generating a power source voltage V1 for driving a capacitive load and the power source 20 generating a power source voltage V2 for driving another load 23 are prepared. In the present embodiment, an example in which a power source voltage V1 for driving a capacitive load and a power source voltage V2 for driving another load 23 are generated from one power source 300 is described with reference to FIG. 13. Note that, configurations and processing similar to Embodiments 1 and 2 are not described or simply described.

The power source 300 is a power source supplying DC power. The power source 300 supplies power for driving a capacitive load and another load 23. A power source voltage V3 of the power source 300 is a voltage higher than a power source voltage V1 of a power source 10 and a power source voltage V2 of a power source 20. In the present embodiment, V3 is 20 V. The power source 300 outputs V3 between a high potential side output terminal 331 and a low potential side output terminal 332. Note that, the low potential side output terminal 332 is grounded and is set to 0 V. The power source 300 is one example of a third power source.

A voltage converter circuit 310 is connected between the power source 300 and a bridge circuit 30, and converts a power source voltage V3 of the power source 300 into a first power source voltage V1. The voltage converter circuit 310 includes a switch element 301, a voltage regulator diode 303, a resistor 304, a resistor 305, a resistor 306, a resistor 307, and a capacitor 308. The voltage converter circuit 310 generates a power source voltage V1 from a power source voltage V3 applied between the high potential side output terminal 331 and the low potential side output terminal 332, and outputs the generated power source voltage V1 between the high potential side output terminal 11 and the low potential side output terminal 12. The voltage converter circuit 310 is one example of a first voltage converter circuit.

A voltage converter circuit 320 converts a power source voltage V3 of the power source 300 into a second power source voltage V2. The voltage converter circuit 320 includes a switch element 302, the voltage regulator diode 303, the resistor 304, the resistor 305, the resistor 306, the resistor 307, and the capacitor 308. The voltage converter circuit 320 generates a power source voltage V2 from a power source voltage V3 applied between the high potential side output terminal 331 and the low potential side output terminal 332, and outputs the generated power source voltage V2 between the high potential side output terminal 21 and the low potential side output terminal 22. The voltage converter circuit 320 is one example of a second voltage converter circuit.

Note that, among the component elements included in the voltage converter circuit 310 and the voltage converter circuit 320, the component elements excluding the switch element 301 and the switch element 302 are shared. The switch element 301 and the switch element 302 are independently controllable, and the first power source voltage V1 and the second power source voltage V2 are independently controllable. The switch element 301 and the switch element 302 are, for example, negative-positive-negative (NPN) transistors. The switch element 301 and the switch element 302 are preferably identical package products with uniform characteristics. Note that, a multi-emitter transistor may be employed instead of the switch element 301 and the switch element 302.

In the present embodiment, the bridge circuit 30 supplies power supplied from the voltage converter circuit 310 to the capacitor 200 that is a capacitive load. Further, the capacitor 50 that is an electric storage element is connected in parallel to the voltage converter circuit 320 and the load 23 receiving power supply from the voltage converter circuit 320. In other words, a drive circuit according to the present embodiment is a circuit in which the power source 10 is replaced with the voltage converter circuit 310 and the power source 300 and the power source 20 is replaced with the voltage converter circuit 320 and the power source 300 in the drive circuit 100 illustrated in FIG. 1.

In the present embodiment, a power source voltage V1 for driving a capacitive load and a power source voltage V2 for driving another load 23 are generated from one power source 300. Accordingly, according to the present embodiment, while a capacitive load and another load 23 are driven by using one power source 300, electric energy accumulated in the capacitive load can be used for driving the another load 23.

Embodiment 4

In Embodiment 1, an example has been described in which the switch element 31 is turned off after the switch element 33 is turned on when a state of the bridge circuit 30 is switched from the first state to the second state, and in which the switch element 33 is turned off after the switch element 31 is turned on when a state of the bridge circuit 30 is switched from the second state to the first state. Timing of switching each switch element is not limited to the example. In the present embodiment, an example is described in which the switch element 31 is turned off before the switch element 33 is turned on when a state of the bridge circuit 30 is switched from the first state to the second state, and in which the switch element 33 is turned off before the switch element 31 is turned on when a state of the bridge circuit 30 is switched from the second state to the first state. Note that, configurations and processing similar to Embodiments 1 to 3 are not described or simply described.

Hereinafter, a sequence of switching each switch element by the control circuit 60 is described with reference to FIGS. 14 and 15. FIG. 14 illustrates a switch switching sequence according to the present embodiment. As illustrated in FIG. 14, in the present embodiment, a state of each switch element is switched in such a way that a term T1, a term T2, a term T3, a term T4, a term T5, a term T6, a term T7, and a term T8 arrive repeatedly in sequence.

The term T1 is a term in which the switch element 31 and the switch element 34 are turned on and the switch element 32 and the switch element 33 are turned off. The term T2 is a term in which the switch element 31 is turned on and the switch element 32, the switch element 33, and the switch element 34 are turned off. The term T3 is a term in which the switch element 31, the switch element 32, the switch element 33, and the switch element 34 are turned off. The term T4 is a term in which the switch element 33 is turned on and the switch element 31, the switch element 32, and the switch element 34 are turned off.

The term T5 is a term in which the switch element 32 and the switch element 33 are turned on and the switch element 31 and the switch element 34 are turned off. The term T6 is a term in which the switch element 33 is turned on and the switch element 31, the switch element 32, and the switch element 34 are turned off. The term T7 is a term in which the switch element 31, the switch element 32, the switch element 33, and the switch element 34 are turned off. The term T8 is a term in which the switch element 31 is turned on and the switch element 32, the switch element 33, and the switch element 34 are turned off.

Figure 15:
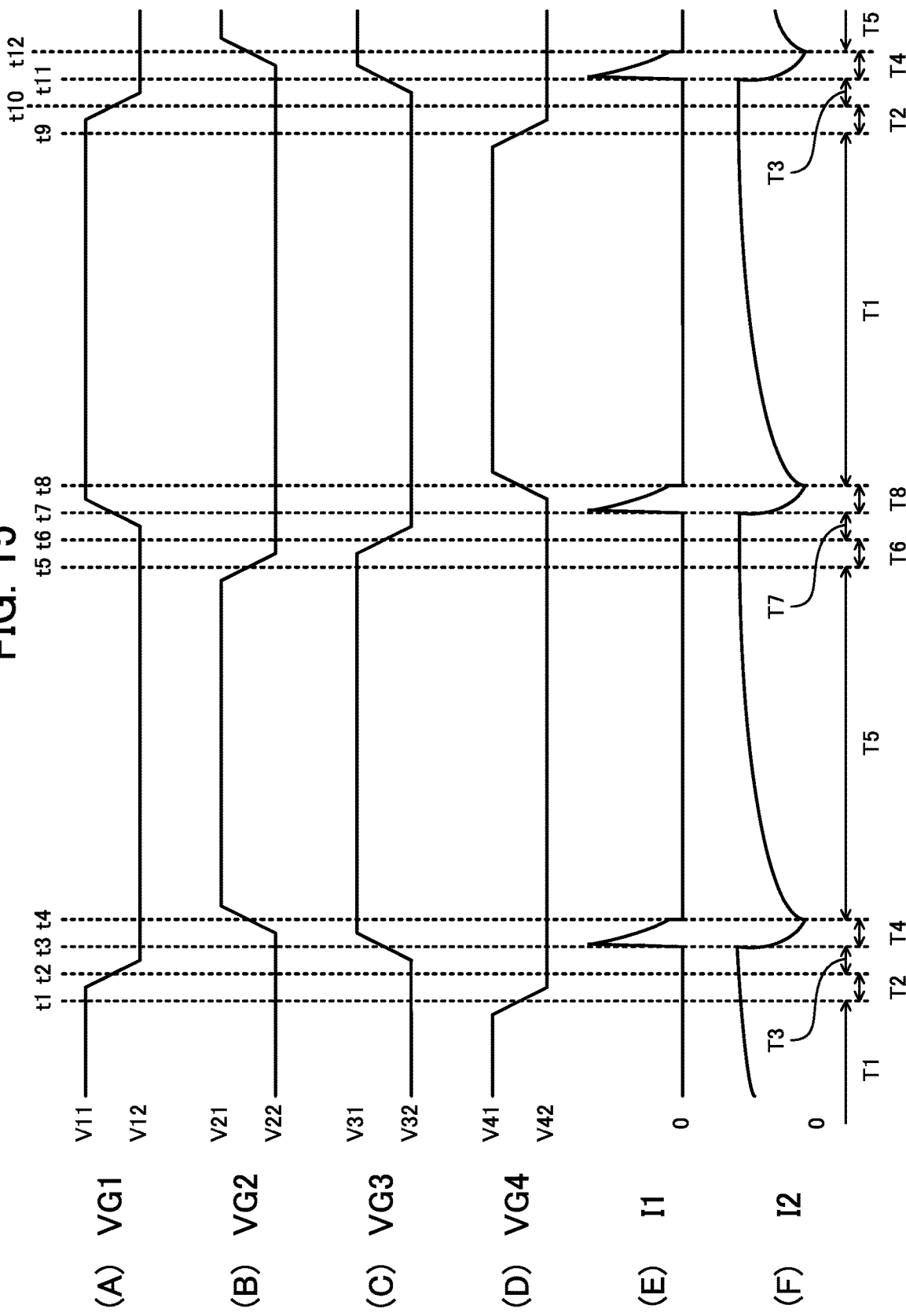
FIG. 15 is a diagram illustrating a temporal change of a signal in each part of a drive circuit according to Embodiment 4, (A) is a diagram illustrating a temporal change of VG1, (B) is a diagram illustrating a temporal change of VG2, (C) is a diagram illustrating a temporal change of VG3, (D) is a diagram illustrating a temporal change of VG4, (E) is a diagram illustrating a temporal change of I1, and (F) is a diagram illustrating a temporal change of I2.

FIG. 15 illustrates a timing chart illustrating a temporal change of a signal in each part of the drive circuit 100 according to the present embodiment. Section (A) of FIG. 15 illustrates a voltage waveform illustrating a temporal change of a gate voltage VG1 of the switch element 31. Section (B) of FIG. 15 illustrates a voltage waveform illustrating a temporal change of a gate voltage VG2 of the switch element 32. Section (C) of FIG. 15 illustrates a voltage waveform illustrating a temporal change of a gate voltage VG3 of the switch element 33. Section (D) of FIG. 15 illustrates a voltage waveform illustrating a temporal change of a gate voltage VG4 of the switch element 34. Section (E) of FIG. 15 illustrates a current waveform illustrating a temporal change of an electric current I1 flowing from the capacitor 200 to the capacitor 50. Section (F) of FIG. 15 illustrates a current waveform illustrating a temporal change of an electric current I2 output by the power source 20.

Before t1, the control circuit 60 supplies a gate drive signal for turning on the switch element 31 to the gate of the switch element 31, supplies a gate drive signal for turning off the switch element 32 to the gate of the switch element 32, supplies a gate drive signal for turning off the switch element 33 to the gate of the switch element 33, and supplies a gate drive signal for turning on the switch element 34 to the gate of the switch element 34.

First, at t1, the control circuit 60 supplies a gate drive signal for turning off the switch element 34 to the gate of the switch element 34. Next, at t2, the control circuit 60 supplies a gate drive signal for turning off the switch element 31 to the gate of the switch element 31. At t3, the control circuit 60 supplies a gate drive signal for turning on the switch element 33 to the gate of the switch element 33. At t3, electric charge accumulated in the capacitor 200 moves to the capacitor 50, and I1 rapidly increases. Further, after t3, electric charge supplied from the power source 20 to the load 23 decreases due to supply of electric charge from the capacitor 50 to the load 23, and I2 decreases.

At t4, the control circuit 60 supplies a gate drive signal for turning on the switch element 32 to the gate of the switch element 32. After t4, electric charge no longer moves from the capacitor 200 to the capacitor 50, and I1 becomes substantially 0. Further, after t4, electric charge supplied from the power source 20 to the load 23 increases due to decrease of electric charge supplied from the capacitor 50 to the load 23, and I2 increases.

At t5, the control circuit 60 supplies a gate drive signal for turning off the switch element 32 to the gate of the switch element 32. At t6, the control circuit 60 supplies a gate drive signal for turning off the switch element 33 to the gate of the switch element 33. Next, at t7, the control circuit 60 supplies a gate drive signal for turning on the switch element 31 to the gate of the switch element 31. At t7, electric charge accumulated in the capacitor 200 moves to the capacitor 50, and I1 rapidly increases. Further, after t7, electric charge supplied from the power source 20 to the load 23 decreases due to supply of electric charge from the capacitor 50 to the load 23, and I2 decreases.

At t8, the control circuit 60 supplies a gate drive signal for turning on the switch element 34 to the gate of the switch element 34. After t8, electric charge no longer moves from the capacitor 200 to the capacitor 50, and I1 becomes substantially 0. Further, after t8, electric charge supplied from the power source 20 to the load 23 increases due to decrease of electric charge supplied from the capacitor 50 to the load 23, and I2 increases. Thereafter, the control circuit 60 repeats a switch control executed from t1 to t8.

In the present embodiment as well, when a state of the bridge circuit 30 is switched between the first state and the second state, the switch element 31, the switch element 32, the switch element 33, and the switch element 34 are not simultaneously switched, but are switched in appropriate order. Accordingly, according to the present embodiment, when a state of the bridge circuit 30 is switched, electric charge stored in the capacitor 200 can be appropriately moved to the capacitor 50.

Embodiment 5

In Embodiment 1, an example has been described in which switch elements are MOSFETs. Various types of elements whose conduction state is controllable can be used as switch elements. In the present embodiment, an example in which switch elements are bipolar transistors is described. Note that, configurations and processing similar to Embodiments 1 to 4 are not described or simply described.

Figure 16:
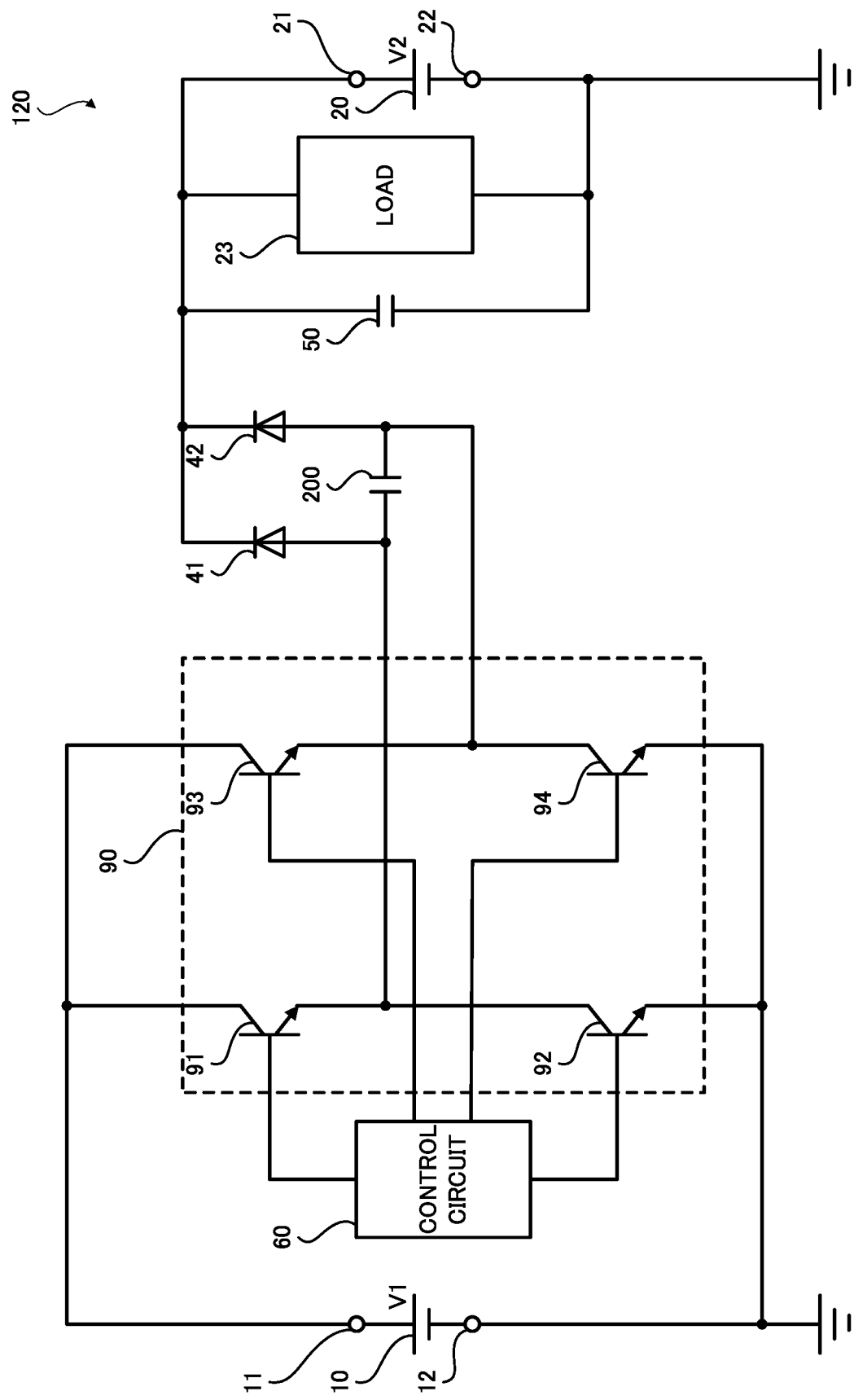
FIG. 16 is a circuit diagram of a drive circuit according to Embodiment 5.

Hereinafter, a configuration of a drive circuit 120 according to the present embodiment is described with reference to FIG. 16. The drive circuit 120 is different from the drive circuit 100 in that the drive circuit 120 includes a bridge circuit 90 instead of the bridge circuit 30 and does not include the diode 71 and the diode 72.

The bridge circuit 90 supplies power supplied from a power source 10 to a capacitor 200. The bridge circuit 90 includes a switch element 91, a switch element 92, a switch element 93, and a switch element 94, and is a circuit alternately applying a first voltage and a second voltage having mutually different polarities to the capacitor 200 that is a capacitive load. The bridge circuit 90 is controlled by a control circuit 60. In the present embodiment, the switch element 91, the switch element 92, the switch element 93, and the switch element 94 are NPN transistors. The switch element 91, the switch element 92, the switch element 93, and the switch element 94 are controlled by gate drive signals supplied from the control circuit 60.

The switch element 91 is connected between a high potential side output terminal 11 of the power source 10 and one end of the capacitor 200. The switch element 92 is connected between a low potential side output terminal 12 of the power source 10 and the one end of the capacitor 200. The switch element 93 is connected between the high potential side output terminal 11 of the power source 10 and another end of the capacitor 200. The switch element 94 is connected between the low potential side output terminal 12 of the power source 10 and the another end of the capacitor 200. The switch element 91 is one example of a first switch element. The switch element 92 is one example of a second switch element. The switch element 93 is one example of a third switch element. The switch element 94 is one example of a fourth switch element.

The control circuit 60 controls the bridge circuit 90 in such a way that a first voltage and a second voltage are applied to the capacitor 200. The control circuit 60 controls the bridge circuit 90 by supplying a gate drive signal to each of the switch element 91, the switch element 92, the switch element 93, and the switch element 94.

In the present embodiment, switch elements are NPN transistors. Accordingly, a switch element is turned on when a base voltage is higher than an emitter voltage by about a base-emitter saturation voltage. For example, when turning on the switch element 91, the control circuit 60 supplies, to a base of the switch element 91, a gate drive signal having a voltage higher than an emitter voltage of the switch element 91 by about a base-emitter saturation voltage. Further, when turning on the switch element 92, the control circuit 60 supplies, to a base of the switch element 92, a gate drive signal having a voltage higher than an emitter voltage 0 V of the switch element 92 by about a base-emitter saturation voltage.

Note that, in the present embodiment, the switch element 91 has no parasitic diode 35 and the switch element 93 has no parasitic diode 37. Accordingly, the diode 71 and the diode 72 are unnecessary.

In the present embodiment as well, when a state of the bridge circuit 90 is switched between the first state and the second state, the switch element 91, the switch element 92, the switch element 93, and the switch element 94 are not simultaneously switched, but are switched in appropriate order. Accordingly, according to the present embodiment, when a state of the bridge circuit 90 is switched, electric charge stored in the capacitor 200 can be appropriately moved to the capacitor 50.

Modification Example

While the embodiments of the present disclosure have been described in the above, modifications and applications in various forms are possible in implementation of the present disclosure. Any part of the configurations, functions, and operations described in the above embodiments may be employed in the present disclosure. Further, besides the configurations, functions, and operations described above, additional configurations, functions, and operations may be employed in the present disclosure. Further, the above embodiments can be freely combined as appropriate. Further, the number of the component elements described in the above embodiments can be adjusted as appropriate. Further, materials, sizes, electric properties, and the like employable in the present disclosure are of course not limited to those indicated in the above embodiments.

In Embodiment 1, an example has been described in which the power source 20 supplying power to the load 23 is a power source having no electric storage function. The power source 20 may be a storage battery that is a power source having an electric storage function. When the power source 20 is a storage battery, the power source 20 is capable of functioning also as the capacitor 50, and thus, the capacitor 50 may not be provided in the drive circuit 100. In this case, a part of electric charge discharged by the capacitor 200 is consumed by the load 23, and a remaining part of the electric charge discharged by the capacitor 200 is accumulated in the power source 20.

In Embodiment 1, an example has been described in which the drive circuit 100 includes the power source 10, the power source 20, and the load 23. The drive circuit 100 may not include the power source 10, the power source 20, and the load 23, and the power source 10, the power source 20, and the load 23 may be provided outside the drive circuit 100.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST 10, 20, 300 Power source
11, 21, 331 High potential side output terminal
12, 22, 332 Low potential side output terminal
23 Load
30, 90 Bridge circuit
31, 32, 33, 34, 81, 91, 92, 93, 94, 301, 302 Switch element
35, 36, 37, 38, 82 Parasitic diode
41, 42, 71, 72 Diode
50, 200, 308 Capacitor
60 Control circuit
80 Step-down circuit
83, 84, 304, 305, 306, 307 Resistor
100, 110, 120 Drive circuit
303 Voltage regulator diode
310, 320 Voltage converter circuit

The invention claimed is:

1. A drive circuit for driving a capacitive load, comprising:
    a bridge circuit including a plurality of switch elements and alternately applying a first voltage and a second voltage having mutually different polarities to the capacitive load;
    a first rectifier element connected to one end of the capacitive load;
    a second rectifier element connected to another end of the capacitive load;
    an electric storage element connected to the first rectifier element and the second rectifier element; and
    a control circuit controlling the plurality of switch elements in such a way that electric charge stored in the capacitive load moves to the electric storage element via the first rectifier element when a voltage applied to the capacitive load transitions from the first voltage to the second voltage and electric charge stored in the capacitive load moves to the electric storage element via the second rectifier element when a voltage applied to the capacitive load transitions from the second voltage to the first voltage.

2. The drive circuit according to claim 1, wherein
    the bridge circuit supplies power supplied from a first power source to the capacitive load, and
    the electric storage element is connected in parallel to a second power source and a load receiving power supply from the second power source.

3. The drive circuit according to claim 2, further comprising:
    a rectifier element preventing reverse flow of electric current from the capacitive load to the first power source via the bridge circuit.

4. The drive circuit according to claim 2, wherein
    the first power source has a power source voltage higher than a power source voltage of the second power source,
    the drive circuit further comprises a step-down circuit stepping down a voltage, and
    the first rectifier element and the second rectifier element are connected to the electric storage element via the step-down circuit.

5. The drive circuit according to claim 2, wherein
    the plurality of switch elements includes a first switch element connected between a high potential side output terminal of the first power source and one end of the capacitive load, a second switch element connected between a low potential side output terminal of the first power source and the one end of the capacitive load, a third switch element connected between the high potential side output terminal of the first power source and another end of the capacitive load, and a fourth switch element connected between the low potential side output terminal of the first power source and the another end of the capacitive load,
    the control circuit moves electric charge stored in the capacitive load to the electric storage element via the first rectifier element by turning off the first switch element and turning on the third switch element between turning off the fourth switch element and turning on the second switch element when switching a state of the bridge circuit from a first state in which the first switch element and the fourth switch element are turned on and the second switch element and the third switch element are turned off to a second state in which the first switch element and the fourth switch element are turned off and the second switch element and the third switch element are turned on, and
    the control circuit moves electric charge stored in the capacitive load to the electric storage element via the second rectifier element by turning on the first switch element and turning off the third switch element between turning off the second switch element and turning on the fourth switch element when switching a state of the bridge circuit from the second state to the first state.

6. The drive circuit according to claim 1, further comprising:
    a first voltage converter circuit connected between a third power source and the bridge circuit and converting a power source voltage of the third power source into a first power source voltage; and a second voltage converter circuit converting the power source voltage of the third power source into a second power source voltage, wherein the bridge circuit supplies power supplied from the first voltage converter circuit to the capacitive load, and the electric storage element is connected in parallel to the second voltage converter circuit and a load receiving power supply from the second voltage converter circuit.

7. The drive circuit according to claim 6, further comprising:

a rectifier element preventing reverse flow of electric current from the capacitive load to the first voltage converter circuit via the bridge circuit.

8. The drive circuit according to claim 6, wherein
the first power source voltage is higher than the second power source voltage,
the drive circuit further comprises a step-down circuit stepping down a voltage, and
the first rectifier element and the second rectifier element are connected to the electric storage element via the step-down circuit.

9. The drive circuit according to claim 6, wherein
the plurality of switch elements includes a first switch element connected between a high potential side output terminal of the first voltage converter circuit and one end of the capacitive load, a second switch element connected between a low potential side output terminal of the first voltage converter circuit and the one end of the capacitive load, a third switch element connected between the high potential side output terminal of the first voltage converter circuit and another end of the capacitive load, and a fourth switch element connected between the low potential side output terminal of the first voltage converter circuit and the another end of the capacitive load, electric charge stored in the capacitive load is moved to the electric storage element via the first rectifier element by turning off the first switch element and turning on the third switch element between turning off the fourth switch element and turning on the second switch element when a state of the bridge circuit is switched from a first state in which the first switch element and the fourth switch element are turned on and the second switch element and the third switch element are turned off to a second state in which the first switch element and the fourth switch element are turned off and the second switch element and the third switch element are turned on, and electric charge stored in the capacitive load is moved to the electric storage element via the second rectifier element by turning on the first switch element and turning off the third switch element between turning off the second switch element and turning on the fourth switch element when a state of the bridge circuit is switched from the second state to the first state.

* * * * *